United States Patent [19]

Scepanovic et al.

[11] Patent Number: 6,068,662
[45] Date of Patent: May 30, 2000

[54] METHOD AND APPARATUS FOR CONGESTION REMOVAL

[75] Inventors: Ranko Scepanovic, San Jose, Calif.; Alexander E. Andreev, Moskovskaga Oblast, Russian Federation; Ivan Pavisic, Cupertino, Calif.

[73] Assignee: LSI Logig Corporation, Milpitas, Calif.

[21] Appl. No.: 08/906,945

[22] Filed: Aug. 6, 1997

[51] Int. Cl.[7] .............................. G06F 19/00; G06F 17/50
[52] U.S. Cl. ....................... 716/2; 716/7; 716/8; 716/12
[58] Field of Search .................... 364/489–491, 364/578; 395/500, 500.02, 500.03, 500.08, 500.09, 500.13

[56] References Cited

U.S. PATENT DOCUMENTS

| | | |
|---|---|---|
| 5,047,949 | 9/1991 | Yamaguchi et al. .................. 364/491 |
| 5,491,641 | 2/1996 | Scepanovic et al. . |
| 5,495,419 | 2/1996 | Rostoker et al. . |
| 5,568,322 | 10/1996 | Azami et al. . |
| 5,568,636 | 10/1996 | Koford . |
| 5,578,840 | 11/1996 | Scepanovic et al. . |
| 5,615,128 | 3/1997 | Scepanovic et al. . |
| 5,636,125 | 6/1997 | Rostoker et al. . |
| 5,638,293 | 6/1997 | Scepanovic et al. . |
| 5,661,663 | 8/1997 | Scepanovic et al. . |
| 5,682,322 | 10/1997 | Boyle et al. . |
| 5,712,793 | 1/1998 | Scepanovic et al. . |
| 5,742,510 | 4/1998 | Rostoker et al. . |
| 5,745,363 | 4/1998 | Rostoker et al. . |
| 5,798,936 | 8/1998 | Cheng ..................................... 364/489 |
| 5,808,899 | 9/1998 | Scepanovic et al. . |

*Primary Examiner*—Kevin J. Teska
*Assistant Examiner*—Kyle J. Choi
*Attorney, Agent, or Firm*—Mitchell, Silberberg & Knupp LLP

[57] ABSTRACT

Integrated circuit chips (IC's) require proper placement of many cells (groups of circuit components) and complex routing of wires to connect the pins of the cells. Because of the large number of the cells and the complex connections required, it is essential that placement of the cell and the wire routine be done correctly to avoid any congestion of wires. The present invention discloses method and apparatus to reduce or to eliminate cell placement and wire routing congestion. The congestion reduction is achieved by first examining regions of the IC to determine whether horizontal or vertical congestion exists. If horizontal congestion exists, then the cells are moved, within the columns, vertically to give more room for the cells and in between the cells for the routing of the wires. If vertical congestion exists, then the cells are moved to different columns to alleviate congestion. The present invention discloses techniques of determining horizontal and vertical congestion and the techniques for moving the cells. The movement of the cells to other columns may create overlapping of the cells or overloading of the columns. The present invention also discloses the methods to resolve the overlapping and overloading problems.

29 Claims, 12 Drawing Sheets

METHOD AND APPARATUS FOR CONGESTION REMOVAL

BACKGROUND OF THE INVENTION

1. Field of the Invention

The present invention generally relates to the art of microelectronic integrated circuits. In particular, the present invention relates to the art of placing cells on semiconductor chips to avoid congestion of cells and wiring.

2. Description of Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

FIG. 1 shows a common organization of an IC. On a semiconductor substrate 10, vertical strips of alternating columns 12 and channels 14 are defined. The cells 16 are fabricated in the columns, and the channels are typically used for running vertical wires to connect the pins 18 of the cells 16. For illustrative purposes, only the rectilinear connections as illustrated by the wire 20. Therefore, all distances are measured using rectilinear or Manhattan distance.

To assign coordinates and to measure distances on the IC 8, a rectangular coordinate grid is used. The coordinate grid has its origin, (0, 0), at the left bottom corner of the IC, and has a horizontal x-axis and a vertical y-axis. In the current art, a typical coordinate grid unit size is about 2 microns but this is expected to decrease as the technology progresses. A typical column of a semiconductor device is approximately 20 grid units wide. The present invention can be applied to grid unit system of any dimensions. The grid unit lines are not shown in the figures; however, grid unit lines, or grid lines, may be referred to in reference to positions on the IC.

For simplicity, the chip 8 of FIG. 1 shows only a few columns; however, in a practical implementation, it is common for a chip to have many hundreds of columns and channels, and hundreds of thousands of cells and about the same number of nets.

The channels of a chip are commonly used to run vertical wires for the chip. To run horizontal wires, another layer of material is fabricated on the surface of the chip. Via's are used to bring the pins up to the second layer for the horizontal connections. If the surface area is at premium, yet another, third layer of material may be fabricated on top of the horizontal-wire layer. This third layer may be used to run the vertical wires, and the width of the channels may be reduced to decrease the overall surface area requirement.

Because there are a large number of pins to connect and the complex nature of the connections required, a proper placement of the cells and the routing of the wires are critical for a successful implementation of a chip. Some placement and routing schemes may result in uneven distribution of cells and wires leading to congestion in some areas of the chip while other areas of the chip may be sparsely used. If the congestion is such that the number of wires required to connect the nets for a particular area is greater than the maximum number of wires which can be fabricated on that region, then that placement cannot be implemented.

SUMMARY OF THE INVENTION

Therefore, an object of the present invention is to provide for a method and apparatus to reduce congestion on an integrated circuit device (IC) by spreading out cells in congested areas, condensing, or packing, cells in uncongested areas, and moving cells to uncongested areas.

The present invention provides for a method of reducing congestion on an integrated circuit device (IC) by first defining pieces of the columns of the IC, determining the density of each piece, and reducing horizontal congestion and vertical congestion if they exist. The horizontal congestion is reduced by spreading out the cells in their own column. The vertical congestion is reduced by moving cells from congested columns to less congested columns.

The present invention also provides for an semiconductor device having cells placed on the device in accordance with the congestion reduction techniques described in this specification.

The present invention also provides for an apparatus for reducing congestion on an integrated circuit device (IC). The apparatus includes a processor and memory connected to the processor. The memory stores instructions for the processor to define pieces and segments of the IC, determine density of the pieces, reduce horizontal congestion of the pieces if horizontal congestion exists, and reduce vertical congestion of the pieces if vertical congestion exists.

These and other aspects, features, and advantages of the present invention will be apparent to those persons having ordinary skill in the art to which the present invention relates from the foregoing description and the accompanying drawings.

DETAILED DESCRIPTION OF THE PREFERRED EMBODIMENT(S)

Figure 2:
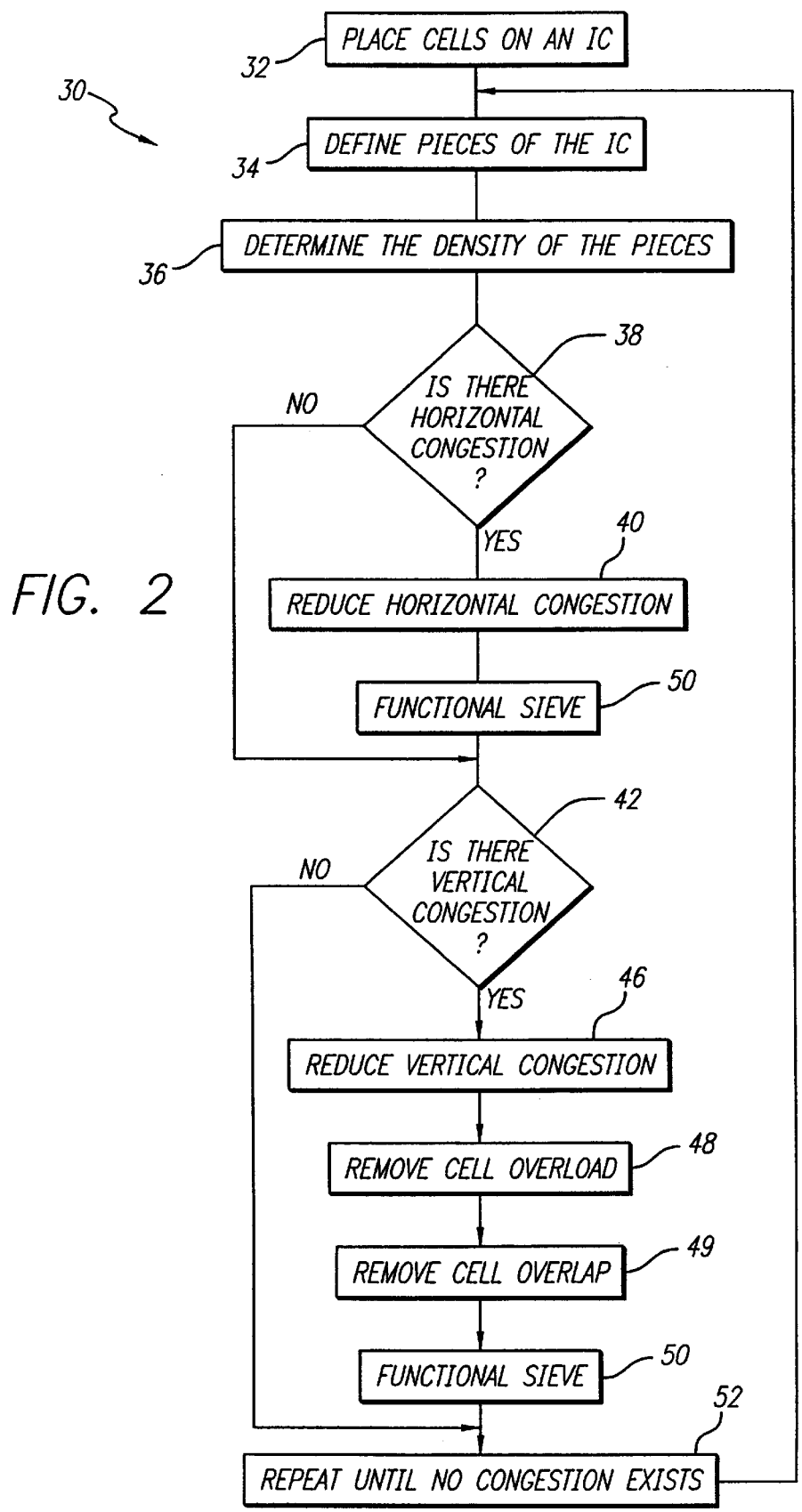
FIG. 2 is a flowchart illustrating the steps of the congestion removal technique.

Referring to FIG. 2, a flowchart 30 illustrating the steps of the congestion removal technique to remove congestion of cells and wires on integrated circuit chips ("IC's") is shown. The technique is applicable only after the placement 32 of the cells on the chip. That is, the cell and wire congestion removal is performed after the cells' initial locations are defined.

Defining Segments and Pieces

Figure 3:
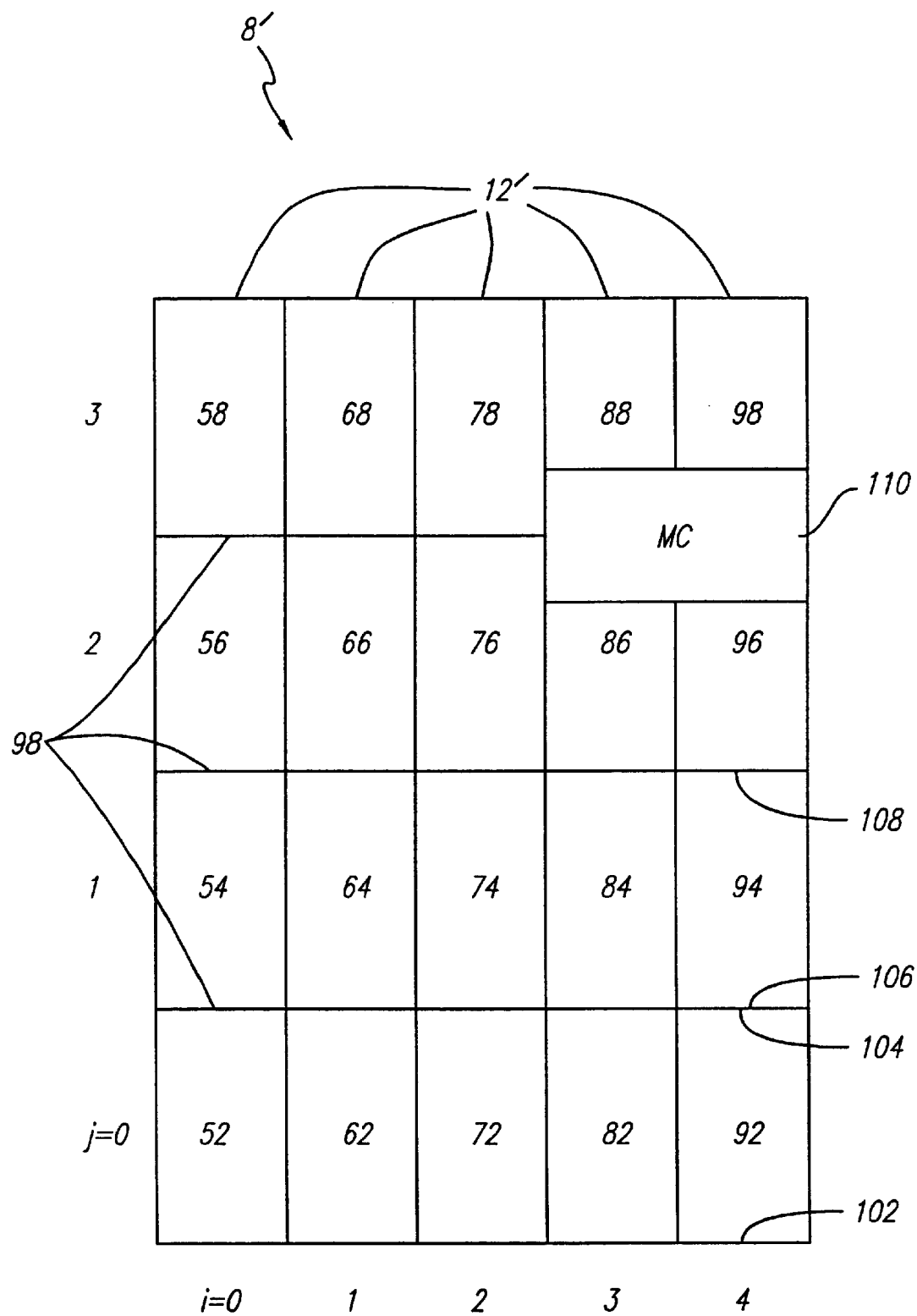
FIG. 3 is a simplified diagram of an integrated circuit device illustrating column segments and pieces of in integrated circuit device (IC)

Referring to FIG. 3 in addition to FIG. 2, the method of the congestion removal technique begins by defining 32 column segments and pieces. As already discussed, a typical IC has columns 12' and channels (not shown in FIG. 3). Because the current invention does not relate to the use of the channels (see 14 of FIG. 1) of the IC, the channels are not shown in FIG. 3 and subsequent figures.

Referring to FIG. 3, the pieces of the IC 8' are defined by defining equally spaced horizontal lines 98 across the IC. Each region defined by the horizontal lines and the column borders define a piece of the IC. Because the columns are of equal width and the horizontal lines are equidistant, the pieces are of equal size.

A segment or a column segment is a set of pieces sharing a column and forming a single contiguous portion. A column may comprise a single segment or multiple segments. For example, each of the columns 0, 1, and 2 contains one segment consisting of all of the pieces of that column. Column 3 consists of two segments. The first segment of column 3 consists of pieces P(3, 0), P(3, 1), and P(3, 2), and the second segment of column 3 consists of piece P(3, 4). Likewise, column 4 consists of two segments. The first segment of column 4 consists of pieces P(4, 0), P(4, 1), and P(4, 2), and the second segment of column 4 consists of a single piece P(4, 4). For clarity, the present patent application will focus on segments which are entire columns.

For the purposes of this discussion, the "size" of the columns, column segments, pieces, and cells will be the "height" of the respective elements unless otherwise noted or the context demands otherwise. The columns are of fixed width, typically 20 grid units, and as such, the column segments and pieces, are of the same width. Also, because cells' thickness and the width are standardized, and because the cells are fabricated into columns of fixed size, the "size" of a cell usually means the height of the cell. For simplicity, the IC 8' of FIG. 3 only shows five (5) columns, each column divided into four (4) pieces. In practical implementation, the number of columns on an IC and the number of pieces per column may be very large. The actual heights of cells are measured in microns.

The size, or the height, of the pieces is arbitrary; however, a preferred embodiment of the present invention initially defines pieces with a height of 100 grid units. The initial piece height may be referred to as the VSTEP and the column width, including the channel width, may be referred to as the HSTEP. Because the columns are typically 20 grid units wide, the initial dimension of the pieces are 20 grid units wide by 100 grid units tall. The pieces will be referred to using the notation P(i, j) where P(i, j) denote the $j^{th}$ piece counted from the bottom of the $i^{th}$ column. Both i and j indices begins with zero (0). Thus, the piece 52 of FIG. 3 is P(0, 0). Piece 74 is piece P(2, 1).

Continuing to refer to FIG. 3, each piece has a bottom and a top. The position of the bottom of a piece P(i, j) is denoted bottom(i, j), and the position of the top of the piece is denoted top(i, j). The left side of the piece is denoted left(i, j), and the right side, right(i,j). The values of bottom(i, j) and top(i, j) are the vertical grid unit position of the piece P(i, j). The values of left(i, j) and right(i, j) are the horizontal grid unit position of the piece P(i, j). For example, bottom(4, 0) 102 of P(4, 0) 92 is zero (0) and the top(4, 0) 104 is 99 because, initially, the pieces are defined as 100 grid units tall in the preferred embodiment. Then, the bottom(4, 1) 106 is 100 and the top(4, 1) 108 is 199.

Not all pieces are defined with 100 grid unit heights. Due to megacells and other predefined areas of the IC, some pieces may be defined to be larger or smaller than 100 grid units. A megacell is a predefined region of an IC where the present invention is not applied. For example, a megacell 110 is predefined in columns 3 and 4 between pieces P(3, 2) 86 and P(3, 3) 88 and between P(4, 2) 96 and P(4, 3) 98. Due to the megacell 110, the affected pieces are not defined to be 100 grid units long. The size of the affected pieces can be arbitrarily determined.

Figure 1:
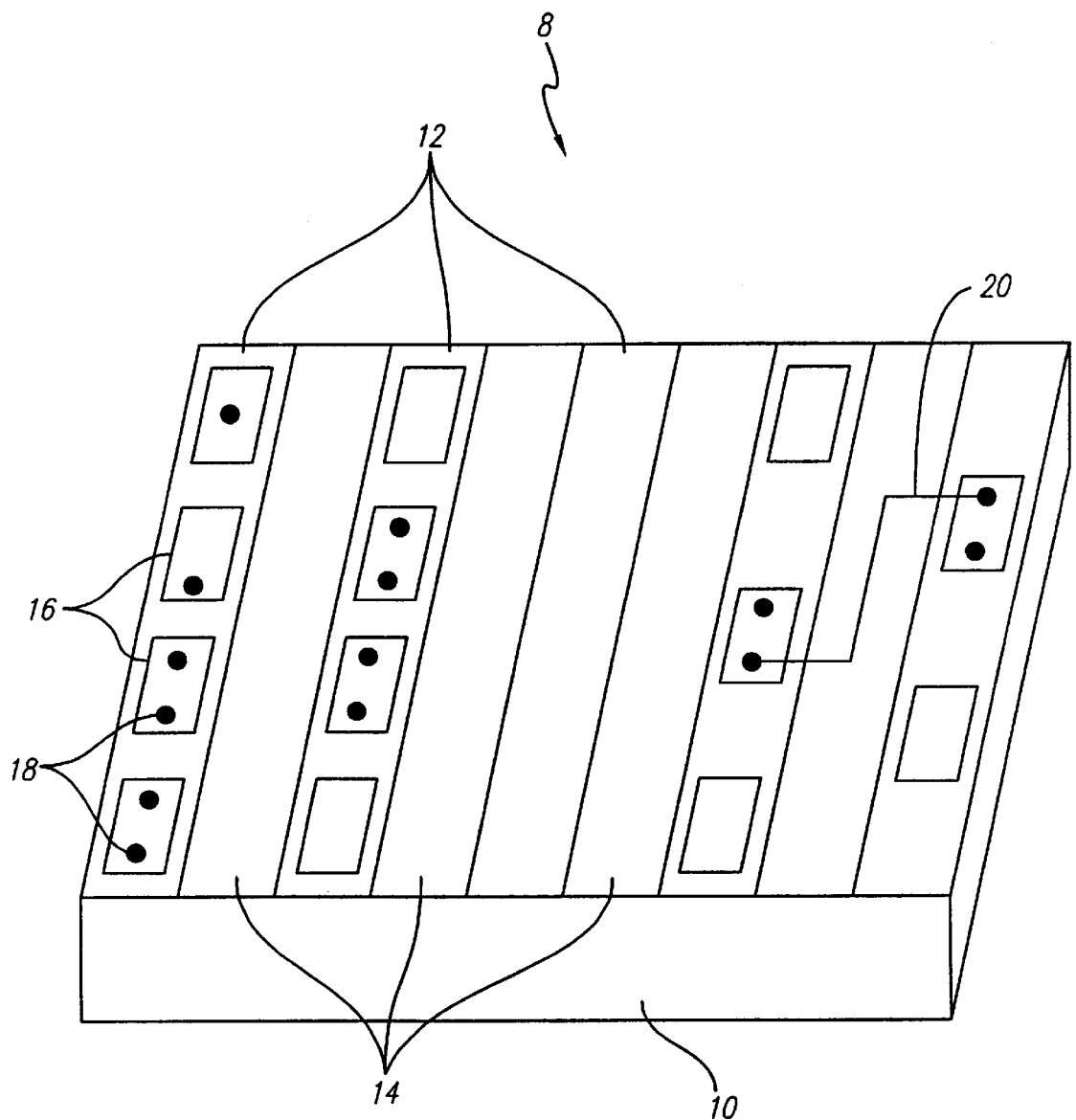
FIG. 1 is a simplified illustration of an integrated circuit chip on a semiconducting material.

For the purposes of the present invention, the channels 14 of FIG. 1 are ignored. Typically, the columns are 20 grid units wide.

Determine Density

To identify congested pieces, four types of density are determined 34 of FIG. 2 for each of the pieces. These are: cell density, cell block density, and horizontal routing density, and vertical routing density.

Cell Density

The cell density of piece P(i, j), denoted cell_den(i, j), is the number of grid units occupied by the cells of the piece. Cell_den(i, j) of P(i, j) can easily be determined by adding the cell heights of the piece.

Cell Block Density

The cell block density of piece P(i, j), denoted block_den(i, j), is the number of grid units occupied by cell blocks. The cell blocks include cell pins, vias and wires which are obstacles for horizontal routing wires. To determine the cell block density, it is helpful to have already created a mask of blocked grid lines for each cell type used on the chip. Again, the block_den(i, j) can be determined by adding the number of pins and vias, and accounting for the grid units taken up by the obstructing wires within the piece. For the purposes of determining density, the pins and vias can be assumed to take, or have the "height" of, one grid unit. As for the obstructing wires, the heights of the wires, or the space take up by the wires, vary according to the actual lengths of the wires.

Horizontal Routing Density

The horizontal routing density of piece P(i, j), denoted hor_den(i, j), is the expected number of horizontal routing wires through P(i, j). It is calculated based on the outputs of the routing procedure. The horizontal routing density can be determined by actually routing the net and counting the number of wires routed through the piece. Alternatively, the horizontal routing density can be determined by quickly determining the edges (the "quick routing technique") of the wire routing scheme and accumulating the probability of the wires going through the piece. For the purposes of determining density, the wires can be assumed to have the thickness, or the "height" of one grid unit because, in the current state of art, a routing wire can be fabricated on each of the grid lines.

The quick routing technique examines the pins and the nets and produces an edgelist containing the edges (both "normal" and superedges) and Steiner pins, also called pseudo pins. An edgelist is a list of edges where an edge is the connection, or routing, between two pins. The pins of an edge may be an actual pin of a cell or a Steiner pin. A Steiner pin is a point or a pin defined during the routing process. A Steiner pin is not associated with a cell, but is used during wire routing to form a better routing solution. An edge may be a "normal" edge defined by a pair of pins which share a same vertical or horizontal coordinate, or an edge may be a superedge. A superedge is defined by a pair of pins which do not share same a vertical or an horizontal coordinate and can be characterized as a minimal bounding box containing the connected pins.

Figure 4:
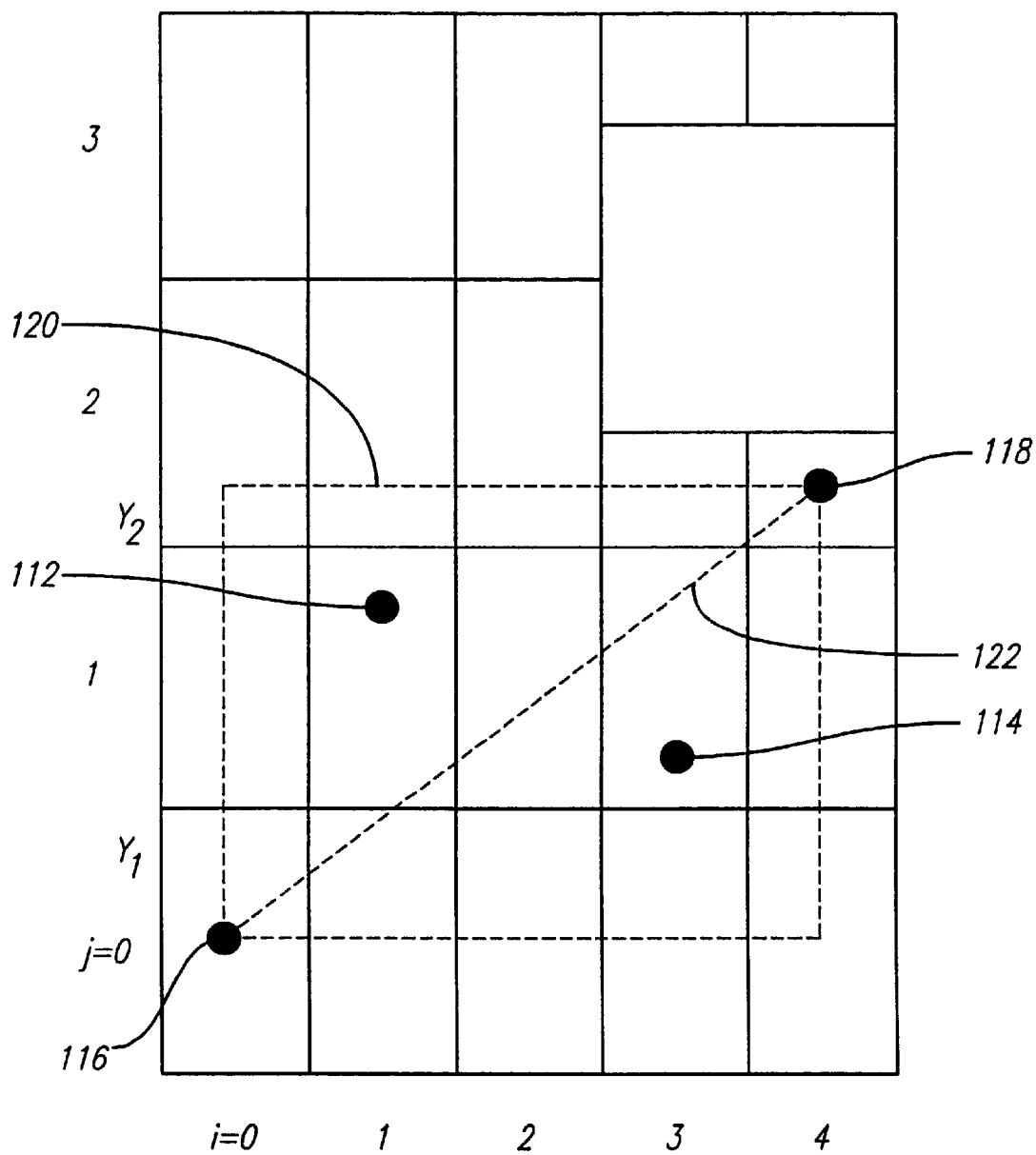
FIG. 4 is a simplified diagram of an integrated circuit device illustrating an edge and a superedge.

Referring to FIG. 4, for determination of horizontal routing density, "normal" horizontal edges crossing piece $P(i, j)$ contributes one wire to the hor_den$(i, j)$. For example, an edge having one of its pins 112 in $P(1, 1)$ and other pin 114 in $P(3, 1)$ contributes one wire to the hor_den$(2, 1)$. However, an edge, a superedge, having a pin 116 in $P(0, 0)$ and the other pin 118 in $P(3, 2)$ may or may not contribute a wire to $P(2, 1)$. The pins will be denoted as $P_{nnn}$ where nnn is the reference number of the pin in the figures of the present application.

The density contribution of a superedge may be distributed equally to all of the pieces of the bounding box of the pins. For example, the horizontal density contribution of the superedge $P_{116}$–$P_{118}$ may be distributed equally, ⅓ each, to the three pieces of the each column of the bounding box 120 defined by the superedge $P_{116}$–$P_{118}$. Using this uniform distribution technique, the superedge $P_{116}$–$P_{118}$ would contribute ⅓ to each of the following horizontal densities: hor_den(1, 0), hor_den(1, 1), hor_den(1, 2), hor_den(2, 0), hor_den(2, 1), hor_den(2, 2), hor_den(3, 0), hor_den(3, 1), and hor_den(3, 2).

Alternatively, the horizontal density contribution of the superedge may be distributed to the pieces using a probability function which depends upon the location of the pins of the superedge and the relative position of the pieces to the pins. This alternative method of horizontal density calculation is performed as follows:

Each pin and pseudo pin, or Steiner pin, adds one (1) to the density of the piece it belongs to. Each edge may increase the density of more than one piece. Assume that an edge E has end points, or pins, $(i_1, y_1)$ and $(i_2, y_2)$ where $i_1$ and $i_2$ are column numbers and $y_1$ and $y_2$ are the grid unit coordinate number in y-direction and where $i_1 \leq i_2$ and $y_1 \leq y_2$. Then, in general, horizontal density of piece $P(i, j)$ is effected by edge E if $P(i, j)$ intersects the bounding box defined by E. Alternatively expressed, horizontal density of piece $P(i, j)$ is effected if $i_1 < i < i_2$ and y1 $\leq$ top$(i, j)$ and bottom$(i, j) \leq y_2$.

If $i_1 = i_2$ or $i_1 + 1 = i_2$, then edge E does not induce any density. For each grid line in $i^{th}$ column, pr$(i, y)$ is the probability that edge E will intersect $i^{th}$ column on $y^{th}$ grid line. The highest probability has the intersection of the $i^{th}$ column with the straight line $(i_1, y_1)$–$(i_2, y_2)$. Assuming that the straight line $(i_1, y_1)$–$(i_2, y_2)$ crosses column segment i at grid line $y_{cross}(i)$, $y_{cross}(i)$ is $y_{cross}(i) = (y_2(i-i_1) + y_1(i_2-i))/(i_2-i_1)$ In our example of FIG. 4, the superedge 120 has the pins such that $i_1 + 4 = i_2$ and the $y_1 \leq$ top$(1, 0)$ and bottom$(3, 2) \leq y_2$. Therefore, the superedge 120 induces density for the pieces P(1, 0), P(1, 1), P(1, 2), P(2, 0), P(2, 1), P(2, 2), P(3, 0), P(3, 1), and P(3, 2).

In a preferred embodiment, the probability linearly decreases between the maximum at $y_{cross}(i)$ and reaches zero (0) for $y < y_1$ and $y > y_2$. Because we are calculating the densities for a piece $P(i, j)$, the probability can be set to zero for the grid lines below the bottom of the piece and for the grid lines above the top of the piece in addition to the grid lines outside the bounding box defined by E. Alternatively expressed, $y_{min}$=max$(y_1$, bottom$(i, j))$, and $y_{max}$=min$(y_2$, top$(i, j))$; and pr$(i, y) = 0$ for $y < y_{min}$ or for $y > y_{max}$.

Then, the probability, pr$(i, y)$ for segment i and for any grid line y is easy to determine as follows:

pr$(i, y) = (T - |y - y_{cross}(i)|)/S$ where $T = y_2 - y_1 + 1$;

and $S = (y_2 - y_1 + 1) * ((y_2 - y_1)/2) * (y_2 - y_{cross}(i) + 1) * (y_{cross}(i) - y_1 + 1)$ note that $S$ is calculated so that $\sum_{y=y_1}^{y_2} pr(i, y) = 1$ Then, the edge E contributes the following density for each grid line in the $i^{th}$ column, thus the following value is added to hor_den$(i, j)$ for each affected piece $P(i, j)$:

$sum(i, y_{min}, y_{max}) = \sum_{y=y_{min}}^{y_{max}} pr(i, y)$

Because pr$(i, y)$ is an arithmetic sequence, the calculation of sum$(i, y_{min}, y_{max})$ can be done analytically with a computationally less expensive method. The following three equations describe the less expensive methods of determining the density:

if $y_{max} \leq y_{cross}(i)$, then sum$(i, y_{min}, y_{max}) = ((2(y_2-y_1+1)-2y_{cross}(i)+y_{min}+y_{max})*(y_{max}-Y_{min}+1)/2)/S$ (1)

if $y_{min} \geq y_{cross}(i)$, then sum$(i, y_{min}, y_{max}) = ((2(y_2-y_1+1)+2y_{cross}(i)-y_{min}-y_{max})*(y_{max}-Y_{min}+1)/2)/S$ (2)

if $y_{min} < y_{cross}(i) < y_{max}$, then sum$(i, y_{min}, y_{max})$=sum$(i, y_{min}, y_{cross}(i))$+sum$(i, y_{cross}(i)+1, y_{max})$.

Vertical Routing Density

The vertical routing density of a piece $P(i, j)$, denoted vert_den$(i, j)$, represents the average expected number of vertical wires through the horizontal grid lines in $P(i, j)$. Assume that an edge E has end points, or pins, $(i_1, y_1)$ and $(i_2, y_2)$ where $i_1$ and $i_2$ are column numbers and $y_1$ and $y_2$ are the grid unit coordinate number in y-direction and where $i_1 \leq i_2$ and $y_1 \leq y_2$. Then in general, vertical density of piece $P(i, j)$ is effected by edge E if $P(i, j)$ intersects the bounding box defined by E. Alternatively expressed, vertical density of piece $P(i, j)$ is effected if $i_1 \leq i \leq i_2$; and $y_1 \leq \text{top}(i, j)$ and $y_2 \leq \text{bottom}(i, j)$.

To simplify the discussion, the following are also defined:

$y_{min} = \max(y_1, \text{bottom}(i, j))$; and $y_{max} = \min(y_2, \text{top}(i, j))$.

If edge E is vertical, that is i1=i2, then the vertical density of P(i, j) is increase by density value=$(y_{max}-y_{min}+1)/(\text{top}(i, j)-\text{bottom}(i, j)+1)$.

If edge E is not vertical, that is $i_1 < i_2$, then the vertical density of P(i, j) is increased by summing the probability, pr(i, y) where y is the grid lines within piece P(i, j). As discussed in detail above, pr(i, y) is the probability that edge E will cross column i at grid line y. The value of pr(i, y) is calculated as described in the *Horizontal Routing Density* subsection.

In addition to the pr(i, y), the following values must be determined to determine the vertical density of a piece P(i, j):

$$\text{number\_of\_halves} = 2(i_2 - i_1)$$

; The value *number_of_halves* is used to
account for the fact that an edge having
a pin at a column $i$ will only cross $1/2$
of the column.

$$\begin{aligned}\text{factor}(i) &= 1/\text{number\_of\_halves} \quad \text{if } i = i_1 \text{ or } i = i_2; \text{ or}\\ &= 2/\text{number\_of\_halves} \quad \text{if } i_1 < i < i_2 \text{ because the}\\ &\quad \text{edge crosses the entire,}\\ &\quad \text{or both halves, of column } i.\end{aligned}$$

$$d(i, j) = \sum_{y=y_{min}}^{y_{max}} pr(i, y)$$

where d(i, j) represents the density to add to piece P(i, j) produced by summing the probabilities contributed by edge E.

Then, the vertical density of the piece P(i, j) is increased by the value determined from the following calculation:

$$\frac{\text{factor}(i) * d(i, j)}{\sum_{t=i_1}^{i_2} \text{factor}(t) * d(i, j)} * \frac{y_{max} - y_{min} + 1}{\text{top}(i, j) - \text{bottom}(i, j) + 1}$$

Determining Whether Horizontal Congestion Exists

To determine, 38 of FIG. 2, whether horizontal congestion exists with the current layout, the following measurements are compared for each segment.

Measurement 1 sum of max(hor_den(i, j)+block_den(i, j), cell_den(i, j)) for all pieces of the segment;

Measurement 2

(Height of the segment)*$Q_{norm}$ where $Q_{norm}$ is a desired segment size factor; in a preferred embodiment, $Q_{norm}$ is 0.85.

If Measurement 1 is greater than Measurement 2, horizontal congestion exists. The horizontal congestion reduction technique can be applied if any horizontal congestion is found, or the number of pieces with horizontal congestion exceeds a predetermined level. In a preferred embodiment, the horizontal congestion reduction technique is applied when at least five percent of the pieces of the IC are horizontally congested.

Reducing Horizontal Congestion

When a horizontal congestion exists, the congestion is reduced and ideally eliminated as shown at 40 of FIG. 2. The congestion is reduced by providing more space for the congested pieces. The allocation of additional spaces to congested pieces allows the cells located within the pieces to be spread out and provides additional space for the wires to be fabricated. To provide additional space to congested pieces, the space has to be taken from uncongested pieces. For instance, referring to FIG. 3, if P(4, 1) 94 is congested while P(4, 0) 92 and P(4, 2) 96 are not, then the bottom(4, 1) and the top(4, 1) are extended to provide P(4, 1) 94 additional space while taking space away from uncongested pieces P(4, 0) 92 and P(4, 2) 96. However, the edges of the pieces are not allowed to move completely freely. The horizontal "movement" of the edges to adjust space allocation is limited to maintain a "smooth" transition of the cells and the wires among the adjacent columns and the adjacent pieces of the columns.

The pieces are categorized into different horizontal types. Pieces belonging to the type 1 category are the pieces having a top and a bottom both of which can be moved. For the type 2 pieces, only the top of the pieces can be moved because the bottom of the pieces are defined at an edge or another predefined border which cannot be moved. The type 3 pieces have fixed, immovable, tops but movable bottoms. Type 4 pieces have fixed top and a fixed bottom and are not considered in the present invention. The sample IC is illustrated by FIG. 2, the following table lists the pieces in their respective horizontal type category:

| Horizontal Type | Pieces of the sample IC of the figures belonging to the Horizontal type |
| --- | --- |
| Type 1 | P(0, 1), P(0, 2), P(1, 1), P(1, 2), P(2, 1), P(2, 2), P(3, 1), P(3, 2), P(4, 1), P(4, 2) |
| Type 2 | P(0, 0), P(1, 0), P(2, 0), P(3, 0), P(4, 0) |
| Type 3 | P(0, 3), P(1, 3), P(2, 3), P(3, 2), P(4, 2) |
| Type 4 | P(3, 3), P(4, 3) |

Resizing Pieces

Ideally, the sizes (the "heights") of the pieces should be the greater of cell_den of the piece or the sum of the block_den and the hor_den of the piece. Also, the sum of the heights of the pieces of a column segment should be equal to or less than the actual height of the column segment; otherwise, the implementation is not feasible. The next step in the method of horizontal congestion removal technique is to resize the pieces depending on the density of the pieces.

To determine the final heights of the pieces, three parameters are introduced to define the initial sizes of the pieces. These variable—$Q_{min}$, $Q_{norm}$, $Q_{max}$—represent the minimal, the desired, and the maximum size of the pieces allowed, respectively. The initial values are arbitrary, but experiences have shown that the following values are useful:

$Q_{min}$ Minimum allowed segment size factor; initial value 0.80

$Q_{norm}$ Desired segment size factor; initial value 0.85

$Q_{max}$ Maximum segment size factor; initial value 1.2

To simplify the discussion, the following notations are also defined:

H(i) is the size (height) of segment i; and

=top(i, $j_{max}$)−bottom(i, $j_{min}$)

where P(i, $j_{min}$) is the bottom-most and P(i, $j_{max}$) is the top-most pieces of segment i; and $H_{max}(i)$ is the maximum height of segment i; and
=$Q_{max}$*H(i)
$H_{norm}(i)$ is the desired height of segment i; and
=$Q_{norm}$*H(i)
$H_{min}(i)$ is the minimum height of the segment i.
=$Q_{min}$*H(i)
size(i, j, $q_i$) is the size of the piece P(i, j) discounted by the factor $q_i$ where $q_i$ is calculated as described below, and is
=max($q_i$*hor_den(i, j)+block_den(i, j), cell_den(i, j))

The value $q_i$ is calculated where $q_i$ is the factor with which each of the pieces of the column segment i must be multiplied to achieve the H(i) for a given Q value such as $Q_{min}$, $Q_{max}$, or $Q_{norm}$. For example, for $Q_{norm}$, the factor $q_i$ is such that $q_i$ satisfies the equation:

$$\sum_{j=j_{min}}^{j_{max}} size(i, j, q_i) = H_{norm}(i)$$

where
$j_{min}$=is the first row; 0 in our example;
$j_{max}$=is the last row; 3 in our example.

The factor $q_i$ is determined using the bisection method.

Note that the hor_den(i, j) is the only element to which the factor $q_i$ is applied. This is because hor_den(i, j) is the only "flexible" factor among the three named factors which contributes to the size of a piece. The other two factors—block_den(i, j) and cell_den(i, j)—are inflexible. Cell_den (i, j) is the sum of the spaces taken by the cells and this cannot be decreased while retaining all the cells. Block_den(i, j) is the sum of the spaces taken by the other "fixed" elements of the piece including pins, vias and obstacle wires.

Smoothing the Rows

Figure 5:
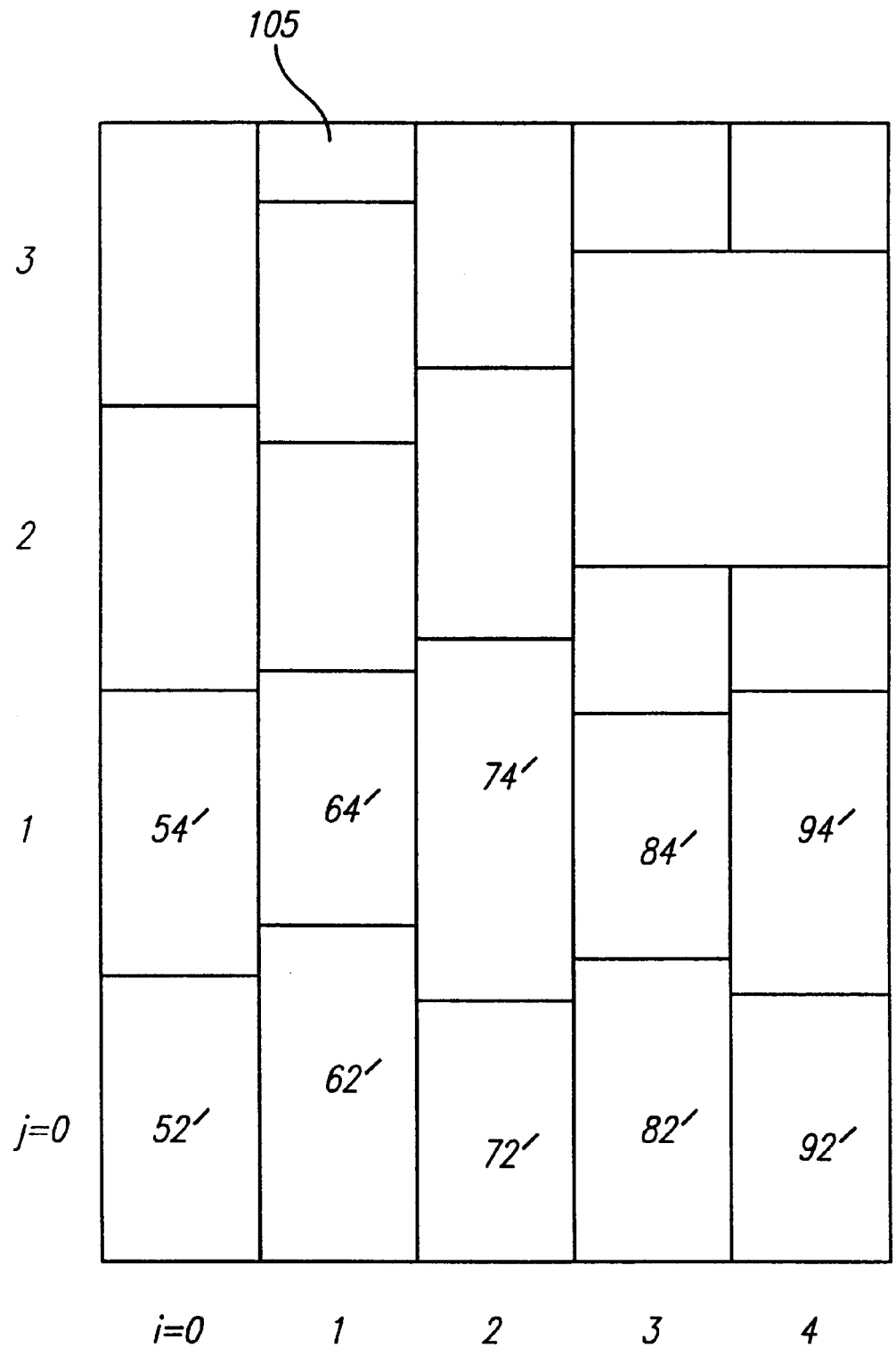
FIG. 5 is a simplified diagram of an integrated circuit device illustrating column-wise resizing and smoothing operations.

To reduce congestion, first, all of the pieces are resized to the size(i, j, $q_i$) using the $q_i$ factor calculated using the $Q_{norm}$ parameter. Because the foregoing process results in differing heights for each of the pieces of the IC, it is likely that the rows of the pieces will not "line up" and will result in adjoining pieces having different heights. As illustrated in FIG. 5, the forgoing process may result in P(1, 0) 62' having a different size (different height) than its preceding piece P(0, 0) 52' and/or the next piece P(2, 0) 72'. After the initial resizing, some columns may even have unassigned spaces as illustrated by reference number 105 of FIG. 5.

Extreme variations of the size of the row-wise-adjacent pieces degrade placement and routing quality. To reduce the variations of the heights of the adjacent pieces, the smoothing operations described are performed. These smoothing operations do not result in a completely leveled rows; however, the operations reduce the variations of the sizes of the row-wise-adjacent pieces to a predetermined value ε*VSTEP (the initial piece height). Parameter ε is an arbitrary factor used to assign the degree of variation of the adjacent pieces. Experiences have shown that a preferred value for ε may range from 0.05 to 0.10. In a preferred embodiment, the initial piece size is 100. Thus, the maximum variation of the adjacent piece size is 0.10*100, or 10 grid units.

The rows may be smoothed using various techniques. In a preferred embodiment, the smoothing is done using the bottom(i, j) values which indicates the location of the bottom of the pieces.

The operation skips the first (the bottom most) row (having j=0) of the pieces because the bottom(i, 0) of the first row pieces are all zero, and lined up.

The operation begins with the second row. The pieces are traversed left-to-right first, then right-to-left, and repeated until the pieces have been stabilized. Beginning with the second pieces of the row, the bottom of the second piece is compared with the bottom of the previous piece of the row. The bottom of the second piece is set to the larger of the following two values:

1. the current bottom of the second piece; or
2. the bottom of the first piece less the ε*VSTEP value Alternatively expressed, the smoothing function performs the following operation to reset a bottom(i, j) value of P(i, j):

bottom(i, j)=max(bottom(i, j), bottom(i–1, j)–ε*VSTEP)

After adjusting the second piece of the row, the third piece of the row is adjusted by comparing the bottom of that piece to the bottom of the previous (now, the second) piece. This operation is continued for the rest of the pieces of the row is adjusted. Then, the operation is repeated beginning at the right side and traversing to the left.

The above operations are repeated for the row until the row stabilizes. The row is stabilized when no changes, or adjustments, are made to the pieces of the row during the left-to-right and the right-to-left adjustment traversals.

After smoothing the second row, the next row is smoothed using the same technique.

Referring to FIG. 5, the IC of FIGS. 3 and 4 is illustrated after having its pieces resized to the desired piece sizes. Unlike the initial piece sizes shown in FIGS. 3 and 4, the pieces now have differing sizes leading to uneven rows. The above-described smoothing technique can be illustrated using the sample IC of FIG. 5.

The pieces of the first row (where j=0) has the bottom(i, 0) value of 0, and are already smooth.

The smoothing operation begins with the second row (where j=1) in the left-to-right direction. For the purposes of this example, assume that ε*VSTEP is 10 and the bottom(i, 1) pieces have the following values after the resizing operation:

| | |
|---|---|
| bottom(0, 1) | 80 |
| bottom(1, 1) | 100 |
| bottom(2, 1) | 87 |
| bottom(3, 1) | 105 |
| bottom(4, 1) | 85 |

First, bottom(1, 1) is compared with bottom(1, 0) and is assigned the number resulting from the following analysis:

bottom(i, j)=max(bottom(i, j), bottom(i–1, j)–ε*VSTEP)

bottom(1, 1)=max(bottom(1, 1), bottom(0, 1)–10)

=max(100, 70)

=100

Thus, bottom(1, 1) does not change.

For bottom(2, 1), bottom(2, 1)=max(bottom(2, 1), bottom(1, 1)–10)

=max(87, 90)

=90

Thus, bottom(2, 1) is set to the grid position 90. The result is that because the bottom(2, 1) is increased, the space allocated to P(2, 0) is increased.

This process is repeated for the pieces of the row j=1. The following table summaries the bottom(i, 1) locations through out the process.

|  | Initial position | Position after resize | Smoothing Process | |
|---|---|---|---|---|
|  |  |  | Position after left-to-right adjustment | Position after right-to-left adjustment |
| bottom(0, 1) | 100 | 80 | 80 | 90 |
| bottom(1, 1) | 100 | 100 | 100 | 100 |
| bottom(2, 1) | 100 | 87 | 90 | 95 |
| bottom(3, 1) | 100 | 105 | 105 | 105 |
| bottom(4, 1) | 100 | 85 | 95 | 95 |

If not stabilized by the first application of the smoothing process, the smoothing process is repeated until the row is stabilized. Stability is achieved when no more adjustments are necessary to the bottom(i, j) values.

In the given example, after one application of the smoothing process, the row has stabilized and no more adjustments are necessary.

The resizing and the smoothing processes may cause some column segments to be over-allocated or under-allocated. Thus, the sizes of the pieces of these segments must be adjusted 40 of FIG. 2.

Removing Excess Heights

The resizing and the smoothing processes may cause some column segments to be over-allocated. This occurs when the sum of the allocated heights of the pieces of a column segment exceeds the total height available in that segment.

The over-allocation is removed by first examining each of the pieces of the segment. The space over and above the maximal heights (calculated using the Qmax factor) of each piece is reclaimed, proportionally from each of the pieces as needed.

If the segment is still over-allocated, then each of the pieces are reexamined. The space over and above the desired heights (calculated using the Qnorm factor) of each piece is reclaimed, proportionally from each of the pieces as needed.

If the segment is still over-allocated, then each of the pieces are again reexamined. The space over and above the minimum heights (calculated using the Qmin factor) of each piece is reclaimed, proportionally from each of the pieces as needed.

Adding (Distributing) Extra Heights

On the other hand, the resizing and the smoothing processes may cause some column segments to be under-allocated. This occurs when the sum of the allocated heights of the pieces of a column segment is less than the total height available in that segment. The distribution of the excess space of an under-allocated segment to the pieces of the segment can be arbitrary. In the preferred embodiment, the excess pieces are distributed as follows:

First, determine the maximal amount of height that can be added to all of the pieces of the segment such that none of the pieces exceed its maximal height is determined. This is accomplished by finding the piece $P(i, i_k)$ with the largest size. Then, each piece of the segment is increased by the following amount:

(size(i, $j_k$, $q_i$) determined using $Q_{max}$)−(current size of P(i, $j_k$)).

Then, the above operation is repeated for the set of pieces consisting of $P(i, j_k+1), \ldots P(i, j_{max})$ where $P(i, j_{max})$ is the upper-most piece of segment i. The operation is repeated until $j_k=j_{max}$. Then, any remaining space is added to $P(i, j_{max})$.

For example, assume a segment has a height of 34 and 8 pieces with the following allocated heights:

$P(i, j_{min})$, P(i, 0)=2;
P(i, 1)=3;
P(i, 2)=2;
P(i, 3)=4;
P(i, 4)=2;
P(i, 5)=3; and
P(i, 6)=3; and
$P(i, j_{max})$, P(i, 7)=3.

Also, let the maximal allowable height of the pieces of the segment be 5. Then, there are 12 height units available for distribution because the total allocated height is 22. The first step is to find the largest piece. In this example, this is P(i, 3) with 4 height units. Then, the amount to add to each of the pieces is 5−4, or 1 height unit. After this operation, the pieces will be allocated the following number of height units (in the order of the pieces as listed above): 3, 4, 3, 5, 3, 4, 4, 4. The operation is repeated for the set of pieces consisting of P(i, 4), . . . P(i, 7), resulting in the following distribution: 3, 4, 3, 5, 4, 5, 5, and 5. In this example, there are no more excess space after the second operation.

Cell Placement Modification

Finally, after the new piece sizes and positions have been determined, the positions of each of the cells in each of the pieces are updated 42 of FIG. 2.

Let $C_1, \ldots, C_n$ be the cells of piece P(i, j), sorted by their vertical positions. Let $G_0, G_1, \ldots, G_n$ be the sizes of gaps between them in their original position, measured in grid units. to calculate new cell positions, it is sufficient to determine new gaps between them.

If the new height of the piece is greater than the old, original height, then the additional height allocation is uniformly distributed to the gaps $G_0, \ldots, G_n$. If the new height of the piece is less than the old, original height, then the total gap is reduced by reducing each of the gaps by one (1) grid unit. The reduction of each gap by one grid unit is repeated until the reduction equals the loss of the allocated height.

Determining Whether Vertical Congestion Exists

To determine, 42 of FIG. 2, whether vertical congestion exists with the current placement and routing of the cells, the actual, physical width of the columns are compared with the "calculated withds" of the columns.

Measurement 1 the value of the function width(i, j, $q_j$) is determine for each of the pieces of the IC where $q_j$ is 1. The function width(i, j, $q_j$) is defined as the max(hor_limit, and ver_limit) where where $$hor\_limit = \frac{\max((q_h * hor\_den(i, j) + block\_den(i, j)), cell\_den(i, j))}{top(i, j) - bottom(i, j) + 1}$$

$$ver\_limit = \frac{column\_only\_width + q_j * vert\_den(i, j)}{column\_width}$$

where

| | |
|---|---|
| $q_h$ | is a fixed parameter. In the preferred embodiment, $q_h$ is set at 0.7; |
| column_only_width | is the width of the column 12 of FIG. 1 only, sans the channel width. In the preferred embodiment, this is about 11 grid units; and |
| column_width | is the width of the column and the channel. In the preferred embodiment, this is about 20 grid units. |

The calculations can be performed using the grid unit values, microns, or millimicrons as long as the units are used consistently. At present state of art, the grid units are about two microns wide.

Measurement 2: the physical width of the columns

If Measurement 1 is greater than Measurement 2, then vertical congestion exists. The vertical congestion reduction technique can be applied if any vertical congestion is found, or the number of pieces with vertical congestion exceeds a predetermined level. In a preferred embodiment, the vertical congestion reduction technique is applied when at least five percent of the pieces of the IC are verically congested.

Reducing Vertical Congestion

Vertical congestion is reduced by moving cells from a piece to another piece in the horizontal direction.

The pieces are categorized into different vertical types. Pieces belonging to the type 1 category are the pieces having a left and a right side both of which can be moved. Type 2 pieces have fixed left side but a movable right side. Type 3 pieces have fixed right side but a movable left side. Type 4 pieces have fixed right and left sides, and are not considered here. In the sample IC is illustrated by FIG. 2, the following table lists the pieces in their respective type category:

| Vertical Type | Pieces of the sample IC of the figures belonging to the Vertical type |
|---|---|
| Type 1 | P(1, 0), P(1, 1), P(1, 2), P(1, 3), P(1, 4), P(2, 0), P(2, 1), P(2, 2), P(2, 3), P(2, 4), P(3, 0), P(3, 1), P(3, 2), P(3, 3), P(3, 4) |
| Type 2 | P(0, 0), P(0, 1), P(0, 2), P(0, 3), P(0, 4) |
| Type 3 | P(4, 0), P(4, 1), P(4, 3), P(4, 4) |
| Type 4 | — |

Resizing Pieces (New Region Widths)

Figure 6:
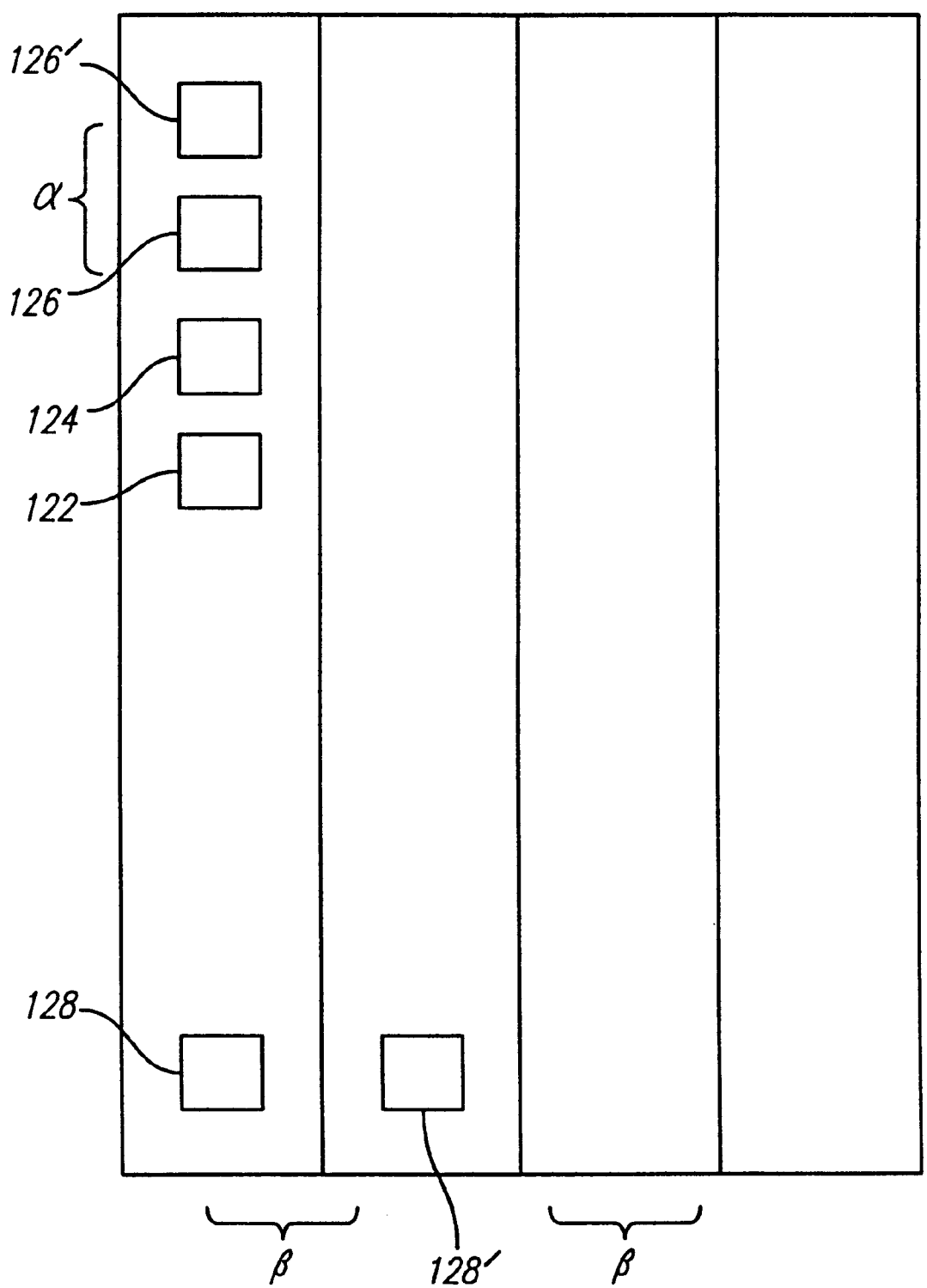
FIG. 6 is a simplified diagram of an integrated circuit device illustrating cell placement modification.

To reduce horizontal congestion, the vertical heights of the pieces are resized to lead to larger pieces allowing the cells and wires crossing the pieces to be spread out. This is possible because the cells are placed in vertical columns and, within each of the columns, the pieces are contiguous, and the cells can be relocated in a continuous fashion. That is, a cell with a grid unit location of (i, y) can be related to another location within the column i, or (i, y+α) where α is any value provided that (i, y+α) is still within the physical size of the IC. This is illustrated by FIG. 6. Horizontal congestion caused by proximal locations of cells 122, 124, and 126 may be reduced by moving the cell 126 to its new location 126'. The movement may be for any grid unit value α.

The method to reduce vertical congestion cannot employ the same technique. This is because the horizontal widths of the columns are fixed, and thus the cells cannot be moved along the horizontal axis freely. The cells must stay within the predefined physical column boundaries. If a cell 128 is to be moved horizontally, it must be moved to another column. Accordingly, its movement must for one or multiples of β grid units where β is the distance between the columns. In FIG. 6, the cell 128, initially located in column 0, is moved to column 1 by moving β grid units in the horizontal direction.

However, for the purpose of determining which cells must be moved to other columns, horizontally, to reduce vertical congestion, the widths of the pieces are "resized" using the similar technique used to resize the heights of the columns in the previous section of the present document. This is a logical construct to allow eventual relocation of the cells.

For this section of the present document discussing the vertical congestion removal, the "size" of the pieces will mean the "widths" of the pieces.

To determine the resized widths of the pieces, three parameters are introduced to define the initial sizes of the pieces. These variable—$Q_{min}$, $Q_{norm}$, $Q_{max}$—represent the minimal, the desired, and the maximum size of the pieces allowed, respectively. The initial values are arbitrary, but experiences have shown that the following values are useful:

$Q_{min}$ Minimum allowed row size (width) factor; initial value 0.80

$Q_{norm}$ Desired row size factor; initial value 0.85

$Q_{max}$ Maximum row size factor; initial value 1.2

To simplify the discussion, the following notations are also defined:

W(j) is the width of row j;
=right($i_{max}$, j)−left($i_{min}$, j)
where P($i_{min}$, j) is the right-most and P($i_{max}$, j) is the left-most pieces of row j; and $W_{max}$(j) is the maximum width of row j; and
=$Q_{max}$*W(j)

$W_{norm}$(j) is the desired width of row j; and
=$Q_{norm}$*W(j)

$W_{min}$(j) is the minimum width of row j.
=$Q_{min}$*W(j)

width(i, j, $q_j$)=width of piece P(i, j) using factor $q_j$ which is the q factor for row j.
=max(hor_limit, ver_limit)

The value $q_j$ is calculated where $q_j$ is the factor with which each of the pieces of the row j must be multiplied to achieve the W(j) for a given Q value such as $Q_{min}$, $Q_{max}$, or $Q_{norm}$. For example, for $Q_{norm}$, the factor $q_j$ is such that $q_j$ satisfies the equation:

$$\sum_{i=i_{min}}^{i_{max}} \text{width}(i, j, q_j) = W_{norm}(j)$$

where $i_{min}$=is the first column; 0 in our example;
$i_{max}$=is the last column; 4 in our example.

The factor $q_j$ is determined using the bisection method.

Note that the widths of the pieces, width(i, j, $q_j$) takes into account both the horizontal congestion, hor_limit, and the vertical congestion, ver_limit. Also note that vert_den(i, j) is the only element to which the factor $q_j$ is applied. This is because vert_den(i, j) is the only "flexible" factor among the factors which contributes to the size of a pieces. Factors block_den(i, j) and cell_den(i, j) are inflexible. Cell_den(i, j) is the sum of the spaces taken by the cells and this cannot be decreased while retaining all the cells. Block_den(i, j) is the sum of the spaces taken by the other "fixed" elements of the piece including pins, vias and obstacle wires.

Smoothing the Columns

Figure 7:
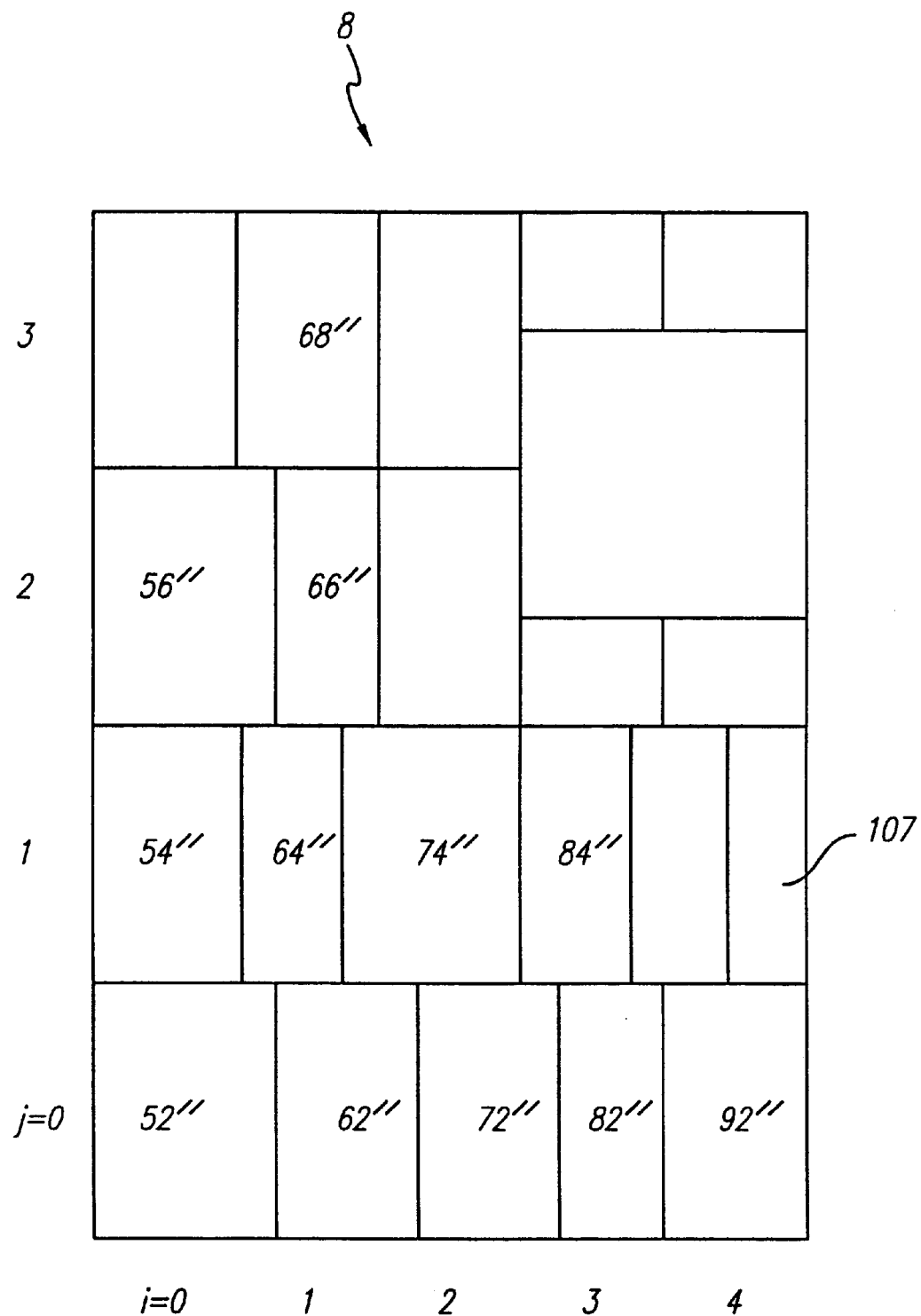
FIG. 7 is a simplified diagram of an integrated circuit device illustrating row-wise resizing and smoothing operations.

To reduce vertical congestion, first, all of the pieces are resized to the width(i, j, $q_j$) using the $q_j$ factor calculated using the $Q_{norm}$ parameter. Because the foregoing process results in differing widths for each of the pieces of the IC, it is likely that the columns of the IC will not "line up" and will result in adjoining pieces having different widths. As illustrated in FIG. 7, the forgoing process may result in columns with pieces having differing widths. For example, the pieces of column 1 have different widths and left(i, j) values. After the initial resizing, some rows may even have unassigned spaces as illustrated by reference number 107 of FIG. 7.

Extreme variations of the widths of the pieces of a column degrade placement and routing quality. To reduce the variations of the heights of the adjacent pieces, the following smoothing operations are performed. The following smoothing operations do not result in columns having same width pieces; however, the operations reduce the variations of the sizes of the column-wise-adjacent pieces to a predetermined value $\epsilon$*HSTEP. Parameter $\epsilon$ is an arbitrary factor used to assign the degree of variation of the adjacent pieces. Experiences have shown that a preferred value for $\epsilon$ may range from 0.05 to 0.10. In a preferred embodiment, the HSTEP 20. Thus, the maximum variation of the adjacent piece size is 0.10*20, or 2 grid units. FIG. 7 shows pieces having larger variations in its widths for illustrative purposes.

The columns may be smoothed using various techniques. In a preferred embodiment, the smoothing is done using the left(i, j) values which indicates the location of the left edge of the pieces.

Each column is smoothed using the following technique:

The operation skips the first (the left most) column (having i=0) of the pieces because the left(0, j) of the first column pieces are all zero, and lined up.

The operation begins with the second column. The pieces are traversed bottom-to-top first, then top-to-bottom, and repeated until the widths of the pieces have been stabilized. Beginning with the second pieces of the column, the left of the second piece is compared with the left of the previous piece (the first piece) of the column. The left of the second piece is set to the larger of the following two values:

1. the current left of the second piece; or
2. the left of the previous piece less the $\epsilon$*HSTEP value.

Alternatively expressed, the smoothing function performs the following operation to reset left(i, j) value of a P(i, j):

left(i, j)=max(left(i, j), left(i, j−1)−$\epsilon$*VSTEP)

After adjusting the second piece of the column, the third piece of the column is adjusted by comparing the left of that piece to the left of the previous (now, the second) piece. This operation is continued for the rest of the pieces of the column. Then, the operation is repeated beginning at the top and traversing to the bottom of the column.

The above operations are repeated for the column until the column stabilizes. A column is stabilized when no changes, or adjustments, are made to the pieces of the column during the bottom-to-top and top-to-bottom adjustment traversals.

After smoothing the second column, the next column is smoothed using the same technique.

Referring to FIG. 7, the IC of FIGS. 3 and 4 is illustrated after having its pieces resized to the desired piece widths. Unlike the initial piece sizes shown in FIGS. 3 and 4, the pieces now have differing widths leading to uneven columns. As already indicated, the smoothing process for the vertical congestion reduction technique is similar to the smoothing process for the horizontal congestion reduction technique detailed in the Horizontal Congestion Removal section above. However, the smoothing for the vertical congestion reduction is applied in the horizontal direction whereas the smoothing for the horizontal congestion reduction is applied in the vertical direction.

The method of removing excess widths from the pieces is similar to the method used to remove excess heights from the pieces discussed above for the horizontal congestion reduction, but applied horizontally. Also, the method of distributing excess widths to the pieces is similar to the method used to add excess heights to the pieces discussed above for the horizontal congestion reduction, but applied horizontally.

Cell Placement Modification

Even after the smoothing process, the widths of the pieces of each of the columns are not likely to be same. The post-resized and post-smoothed pieces will be denoted P"(i, j) where i is the column number beginning with 0 for the left-most column and j is the row number beginning with 0 for the bottom-most row. Piece P"(i, j) has left"(i, j), which is the grid unit of the left edge of the piece.

After the resizing and the smoothing operations, but before the cell placement modification operation, pieces P"(i, j) still have the cells of the pre-resized and pre-smoothed original piece P(i, j).

To modify the placement of each of the cells of the pieces, the new location, left"(i, j) and the new sizes of each of the pieces, P"(i, j), are compared with the initial location, left(i, j) and the initial sizes of the pieces P(i, j). Then, the cells of the piece P"(i, j) are proportionally distributed to the pieces which were initially located in the area of the IC the now resized and smoothed piece occupies. This is best illustrated using an example.

Figure 8:
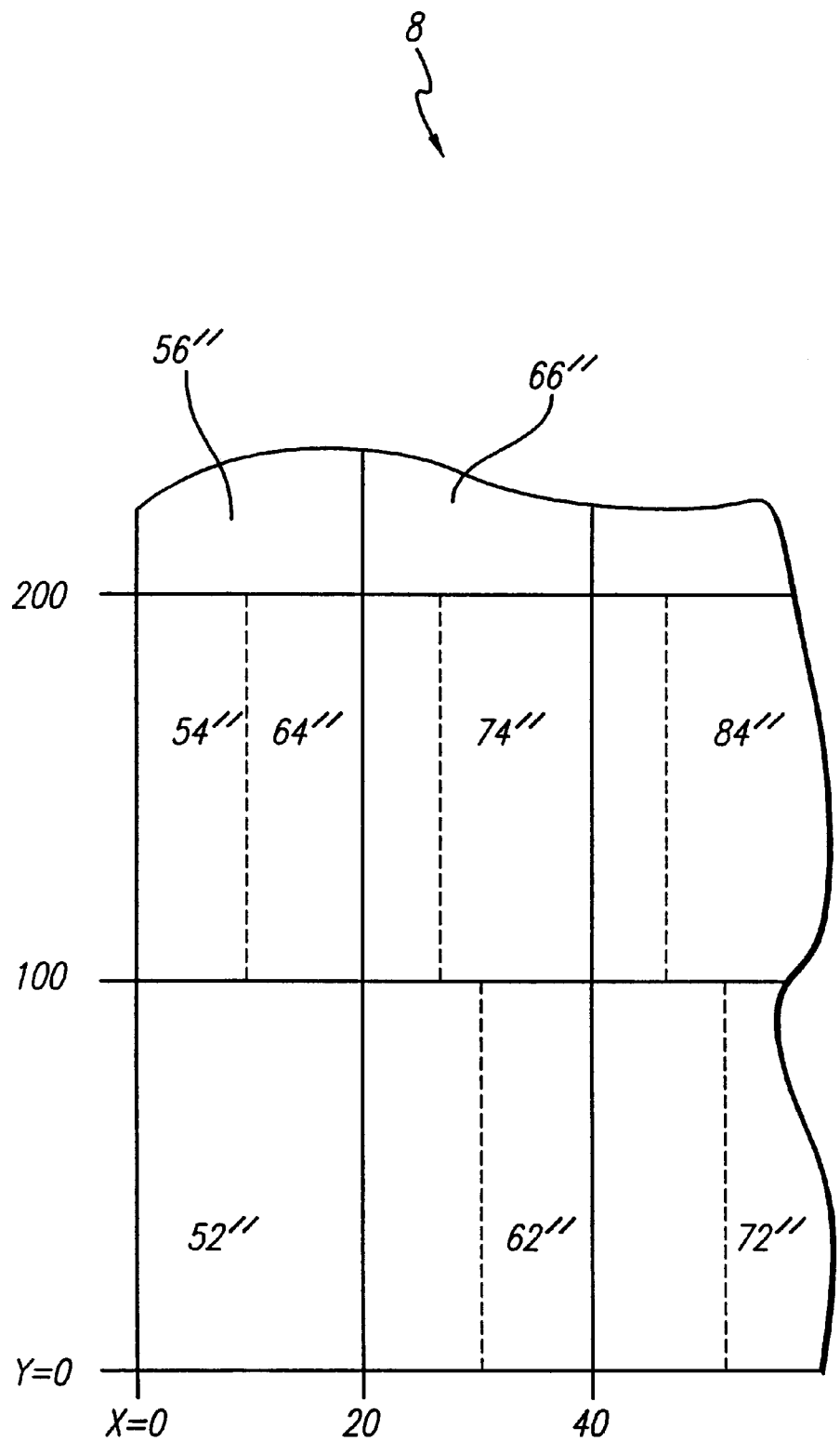
FIG. 8 is a simplified diagram of an integrated circuit device illustrating the technique of comparing original and new row locations and widths.

Referring now to FIG. 7, the IC 8" of FIGS. 3 and 4 is illustrated after having its pieces resized to the desired piece widths. Unlike the initial piece sizes shown in FIGS. 3 and 4, the pieces now have differing widths leading to uneven columns. The IC 8" was used, above, to illustrate resized but not yet smoothed state of the pieces. Here, the IC 8" will be used to represent the resized and smoothed state of the pieces. Even though the left"(i , j) of the pieces are greater than $\epsilon$*VSTEP in the examples as illustrated in FIGS. 7 and 8, this is irrelevant to the cell placement modification technique to be illustrated here. The cell placement modification technique of the vertical congestion removal technique is applicable independent of the degree of smoothness between the pieces of a column.

FIG. 8 shows the left bottom corner of IC 8" showing pieces P"(0, 0) 52", P"(0, 1) 54",P"(1, 0) 62",P"(1, 1) 64",and P"(2, 1) 74",and portions of P"(2, 0) 72",P"(3, 1) 84", P"(0, 3) 56", P"(1, 3) 66". The following table lists the pieces of the IC 8", their positions and widths, and the initial positions and the widths of the corresponding pieces. Note that FIG. 8 shows the grid unit scale of the IC 8" in x and y axis.

| Piece"(i, j) | Position and Size after resizing and smoothing (in grid units) | | Initial Position and Size (in grid units) | | Piece(s) originally located at the space occupied by P"(i, j) |
| --- | --- | --- | --- | --- | --- |
| | left"(i, j) | width"(i, j) | left(i, j) | width(i, j) | |
| P"(0, 0) 52" | 0 | 30 | 0 | 20 | P(0, 0), P(1, 0) |
| P"(1, 0) 62" | 30 | 20 | 20 | 20 | P(1, 0), P(2, 0) |
| P"(0, 1) 54" | 0 | 15 | 0 | 20 | P(0, 1) |
| P"(1, 1) 64" | 15 | 10 | 20 | 20 | P(0, 1), P(1, 1) |
| P"(2, 1) 74" | 25 | 20 | 40 | 20 | P(1, 1), P(2, 1) |

In the example as presented by FIG. 8, the cells of the illustrated pieces will be distributed as follows:

The placement of the cells of piece P"(0, 0) 52": The piece P"(0, 0) 52" extends over the area originally allocated to P(0, 0) and a portion of P(1, 0). In fact, because piece P"(0, 0) 52" is 30 grid units wide, ⅔ of the piece is located within the area allocated to P(0, 0) and ⅓ of the piece is located within the area allocated to P(1, 0). In this case, ⅔ of the cells of the piece P"(0,) 0) are kept by piece P(0, 0) and ⅓ of the cells are moved to piece P(1, 0). The determination as to which cells of P"(0, 0) are assigned to P(0, 0) and which are assigned to P(1, 0) is arbitrary. In the preferred embodiment, a random number is assigned to each of the cells of the piece and the value of the random numbers is used for the determination. For example, the cells of the piece P"(0, 0) are randomly assigned to one of three numbers–1, 2, or 3. Then, the cells assigned to one of the three numbers, say 3, is assigned to P(1, 0) while the other cells are assigned to P(0, 0). Also, when horizontally moving cells to another columns, the cells' vertical coordinate is not changed.

The placement of the cells of piece P"(1, 0) 62": The piece P"(1, 0) 62" extends over the area originally allocated to P(1, 0), P(2, 0). In fact, ½ of P"(1, 0) is in the P(1, 0) area while the other ½ of P"(1, 0) is in the P(2, 0). In this case, ½ of the cells of P"(1, 0) are kept by piece P(1, 0) and the other ½ of the cells of P"(1, 0) are moved to P(2, 0). Again, the cells assignment are arbitrary.

The placement of the cells of piece P"(0, 1) 54": The piece P"(0, 1) 54" lies within the area originally allocated to itself P(0, 1). Placement of the cells of P"(0, 1) 54" is not modified.

The placement of the cells of piece P"(1, 1) 64": The piece P"(1, 1) 64" extends over the area originally allocated to P(0, 1), P(1, 1). In fact, ½ of P"(1, 1) 64" is in the P(0, 1) area while the other ½ of P"(1, 1) 64" is in the P(1, 1). In this case, ½ of the cells of P"(1, 1) 64" are kept by piece P(1, 1) and the other ½ of the cells of P"(1, 1) 64" are moved to P(0, 1).

The placement of the cells of piece P"(2, 1) 74": The piece P"(2, 1) 74" extends over the area originally allocated to P(1, 1), P(2, 1). In fact, ¾ of P"(2, 1) 74" is in the P(1, 1) area while the other ¼ of P"(2, 1) 74" is in the P(2, 1) area. In this case, ¾ of the cells of P"(2, 1) 74" are moved to the P(1, 1) area while ¼ of the cells of P"(2, 1) 74" are kept in the P(2, 1) area.

Overlap Removal

Figure 9:
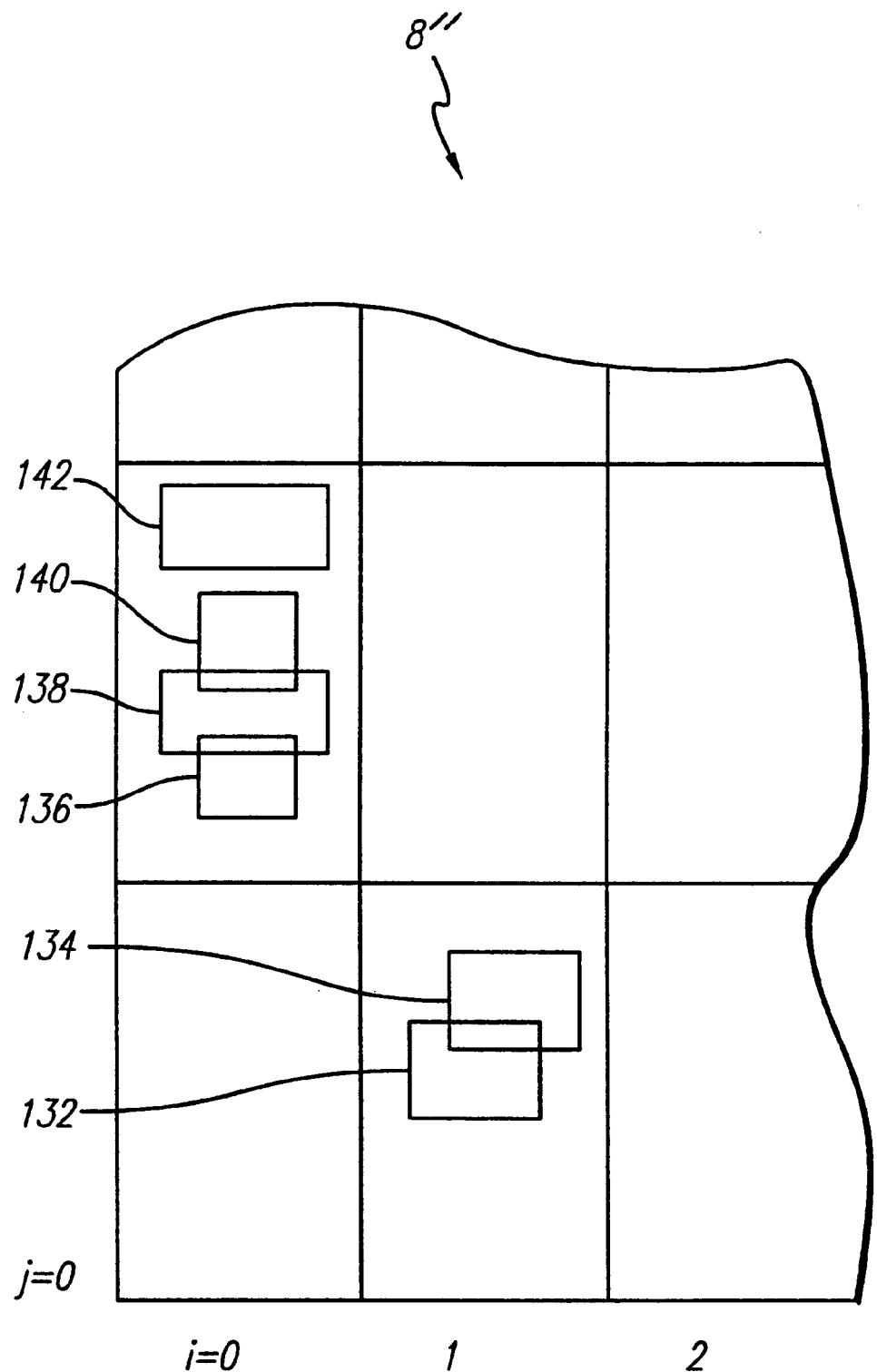
FIG. 9 is a simplified diagram of an integrated circuit device illustrating cell overlap and segment overload.

Because the vertical coordinates of the cells are not modified when horizontally moving the cells, a potential exists for overlapping cells. Such overlaps must be resolved 49 of FIG. 2. Referring now to FIG. 9, a portion of the IC of FIGS. 7 and 8 is illustrated. In the example illustrated in FIG. 9, cell 132, assigned from P"(0, 0) to P(1, 0) may overlap with cell 134 assigned from P"(1, 0) to P(1, 0). Cell overlaps can be removed using the Overlap Remover technique disclosed by the patent application entitled "Advanced Modular Cell Placement System with Overlap Remover with Minimal Noise", Ser. No. 08/627,937, filed on Jun. 28, 1996. The entire patent application entitled "Advanced Modular Cell Placement System with Overlap Remover with Minimal Noise", Ser. No. 08/627,937, filed on Jun. 28, 1996 is hereby incorporated into the present patent application.

Continuous Column Density Optimization (Overload Removal)

Another situation which may arise from the modification of cell placements is that too many cells may be assigned to a column segment or to a column. In that case, the total cell heights required to be placed within the column segment, or within the column may be larger than the available space. Referring again to FIG. 9, a portion of the IC of FIGS. 7 and 8 is illustrated. In the example illustrated in FIG. 9, cells 136, 138, 140, 142, and 142 are all assigned to the piece.

Here, not only are there two overlaps—one between cells 136 and 138, the other between cells 138 and 140—but also the sum of the heights of the cells exceed the height of the piece P(0, 1). The overload exists for P(0, 1). Overload situation may exist for a piece, a column segment, or for an entire segment, and must be resolved 48 of FIG. 2.

The present inventive technique, the Continuous Column Density Optimization, modifies cell placements by moving cells to reduce or eliminate the overload.

Segment Definition

To analyze cell overload and implement the present technique, column segments, or segments, are defined on the IC. As illustrated in FIG. 1 and explained by corresponding discussion, the physical structure of an IC comprises columns and channels. Because the current invention does not relate to the use of the channels (see 14 of FIG. 1) of the IC, the channels are not shown in FIG. 3 and subsequent figures.

Figure 10:
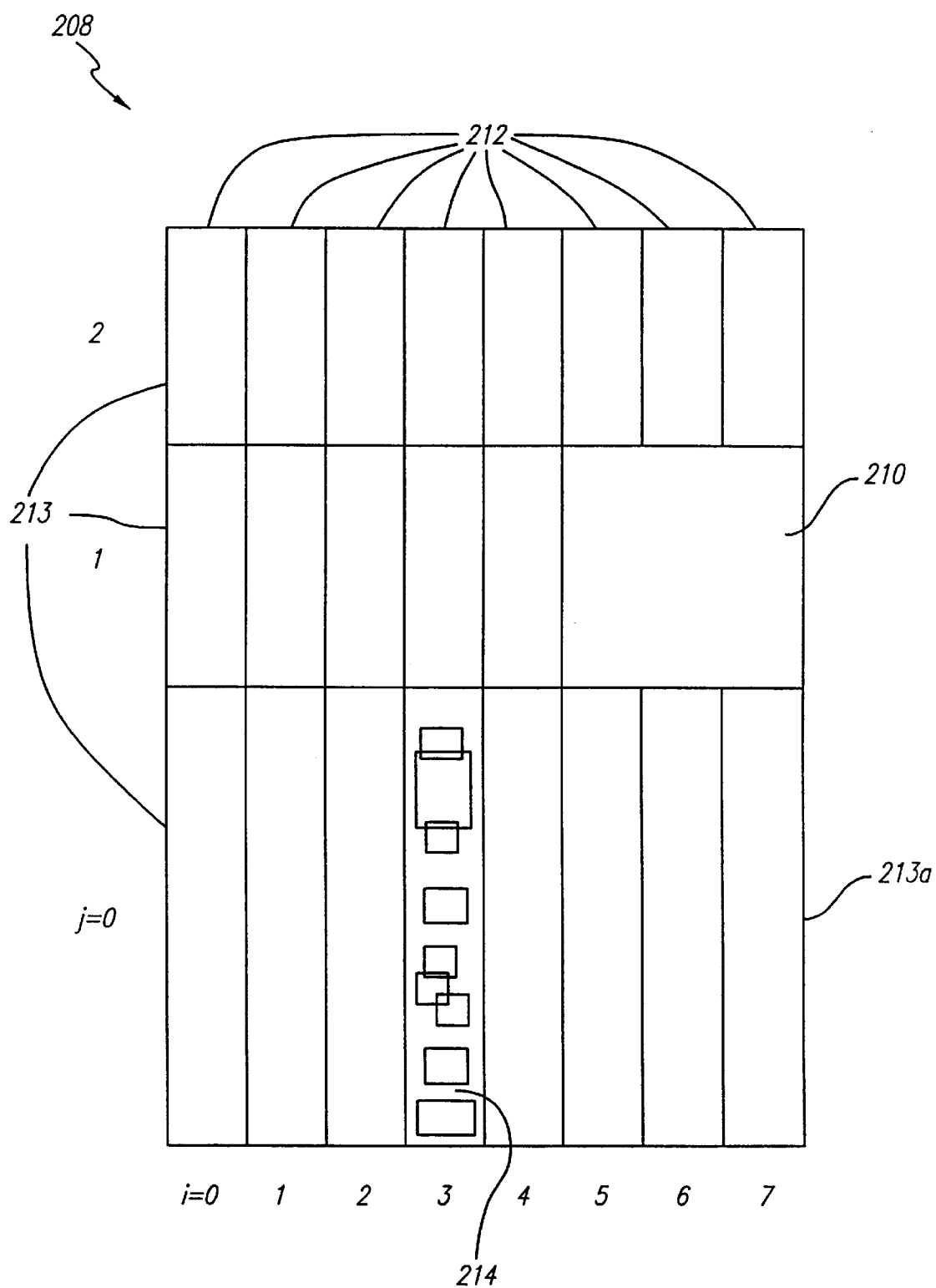
FIG. 10 is a simplified diagram of an integrated circuit device illustrating column segmentation technique.

Segments, for the purposes of implementing the Continuous Column Density Optimization technique, are not defined in the same way as the segment or the piece used for the congestion removal technique. For the purposes of Continuous Column Density Optimization (Overload Removal) technique, a segment or a column segment is defined by defining horizontal lines across the IC. Each region defined by the horizontal lines and the column borders define a segment of the IC. Because the columns are of equal width, the segments of any row are of equal size. The horizontal lines need not be equidistant. Alternatively, entire column may be defined as a single segment. In this case, no horizontal lines need be defined. FIG. 10 shows an IC 208, having eight columns 212, each column defined to include three segments resulting in three rows 213 of segments. Each column, and each segment of the column, comprises cells. For simplicity, the cells are illustrated in only one segment, S(0, 3) 214 of IC 208 of FIG. 10. The a preferred embodiment, the segments are 300 grid units tall.

The Continuous Column Density Optimization (Overload Removal) technique is applied to each of the rows of the segments as follows:

Determine New Distribution

Figure 11:
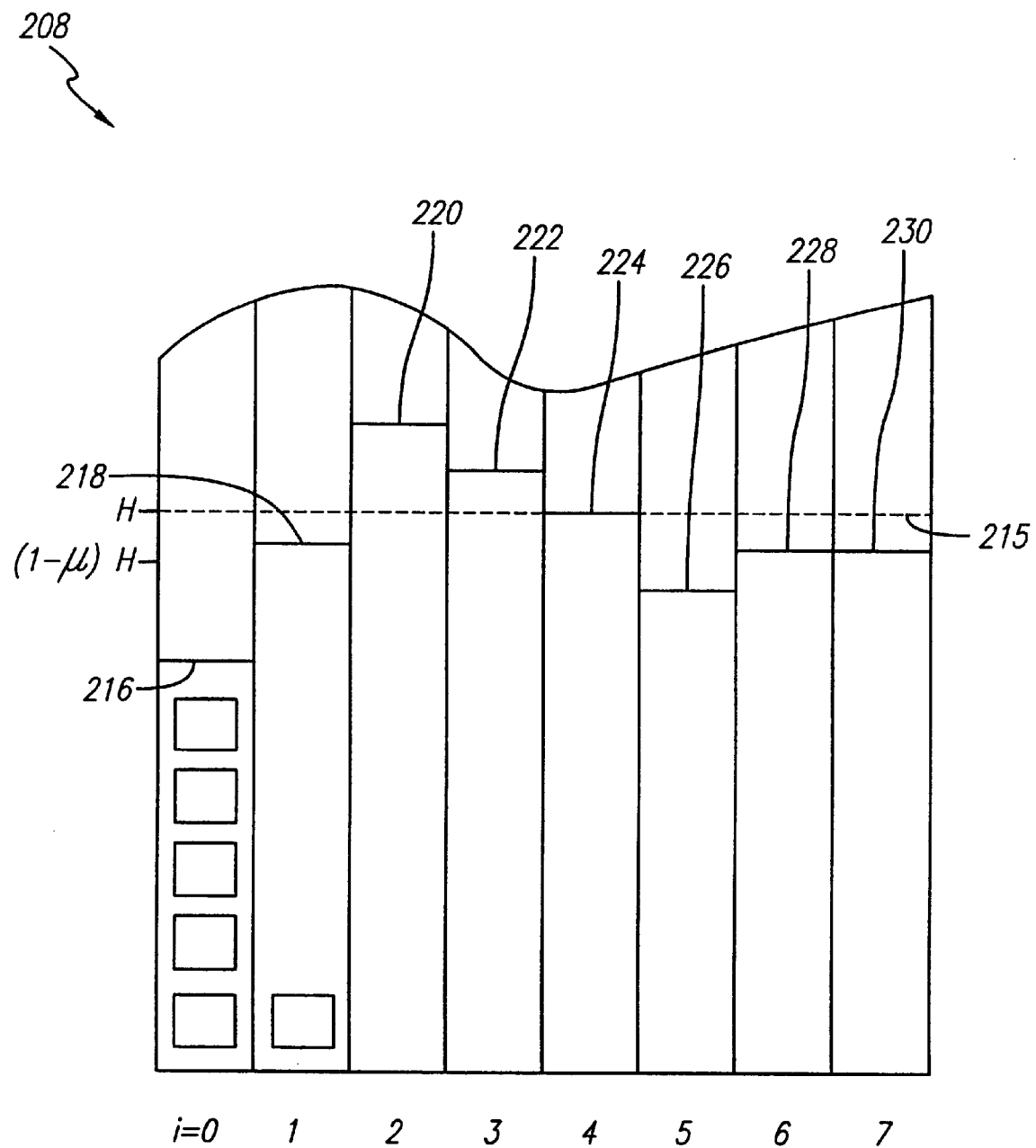
FIG. 11 is a simplified diagram of an integrated circuit device illustrating continuous column density optimization technique.

Referring to FIG. 11, a portion of the IC 208 of FIG. 10 is reproduced to illustrate the Continuous Column Density Optimization (Overload Removal) technique. The figure reproduces the first row, the $0^{th}$ row. For the purposes of illustration the row has been defined with an horizontal line at 300 grid units from the bottom. The "top" of the row is delineated by the dashed line 215. Thus, the physical height available within each segment of the row, of the present example, is 300 grid units.

Also shown in FIG. 11 is the sum of the height of the cells of each of the segments. The following table summaries the sum of the height of the cells for each of the segments of the sample IC 108 of FIGS. 10 and 11:

| Segment i = | ch(i), sum of the heights of the cells of the segment | reference number indicating the sum value in FIG. 11 |
| --- | --- | --- |
| 0 | 225 | 216 |
| 1 | 275 | 218 |
| 2 | 350 | 220 |

-continued

| Segment i = | ch(i), sum of the heights of the cells of the segment | reference number indicating the sum value in FIG. 11 |
|---|---|---|
| 3 | 325 | 222 |
| 4 | 300 | 224 |
| 5 | 225 | 226 |
| 6 | 275 | 228 |
| 7 | 275 | 230 |

As indicated in FIG. 11 and listed on the above table, each of segments S(0, 2), S(0, 3), and S(0, 5) has cells total heights of which are greater than the available space within the perspective segments. In these segments, overload exists. The main idea underlying the Continuous Column Density Optimization (Overload Removal) technique is to reduce or eliminate the overloaded condition by redistributing cells from the overloaded segments to the non-overloaded segments. However, the cell should be moved to minimize disruptions to the present layout and wire routing.

For the purposes of discussing the Continuous Column Density Optimization (Overload Removal) technique, the following terms and definitions are used:

S(i, j) the $i^{th}$ segment of the $j^{th}$ row;

$S_i$ the $i^{th}$ segment of the current row;

n the number of segments; In the present example, n=8 segments numbered 0, 1, . . . 7.

$S_0, \ldots, S_n$ the sequence of segments to which the technique is applied;

H the height of the segments. In the present example, H=300 grid units;

ch(i) the sum of the heights of the cells of the segment $S_i$;

ch_total the sum of the heights of the cells of all the segments, or $$= \sum_{i=0}^{n} ch(i)$$

First, the total overload is calculated by adding the heights of the cells exceeding $H(1-\mu)$, or $$total\_overload = \sum_{i=0}^{n} \max(0, ch(i) - H(1-\mu))$$

where $\mu$ is a predefined parameter, greater than or equal to zero, responsible for the degree to which the new cell distribution will be uniform. If $\mu$ is zero, then total_overload is a measure of the heights of the cells exceeding H, the capacity of the segments. To remove the overload only, $\mu$ is assigned to a very small number or a zero. To uniformly distribute the cells to the segments, then $\mu$ is assigned to the following number: $\mu=1-ch\_total/(n*H)$. Typically, $\mu$ is assigned the number ½ *(1-ch_total/(n*H)). In the preferred embodiment, $\mu$ is assigned a value of 0.05, leading to the $H(1-\mu)$ value of (1-0.5)300 or 285.

Figure 12:
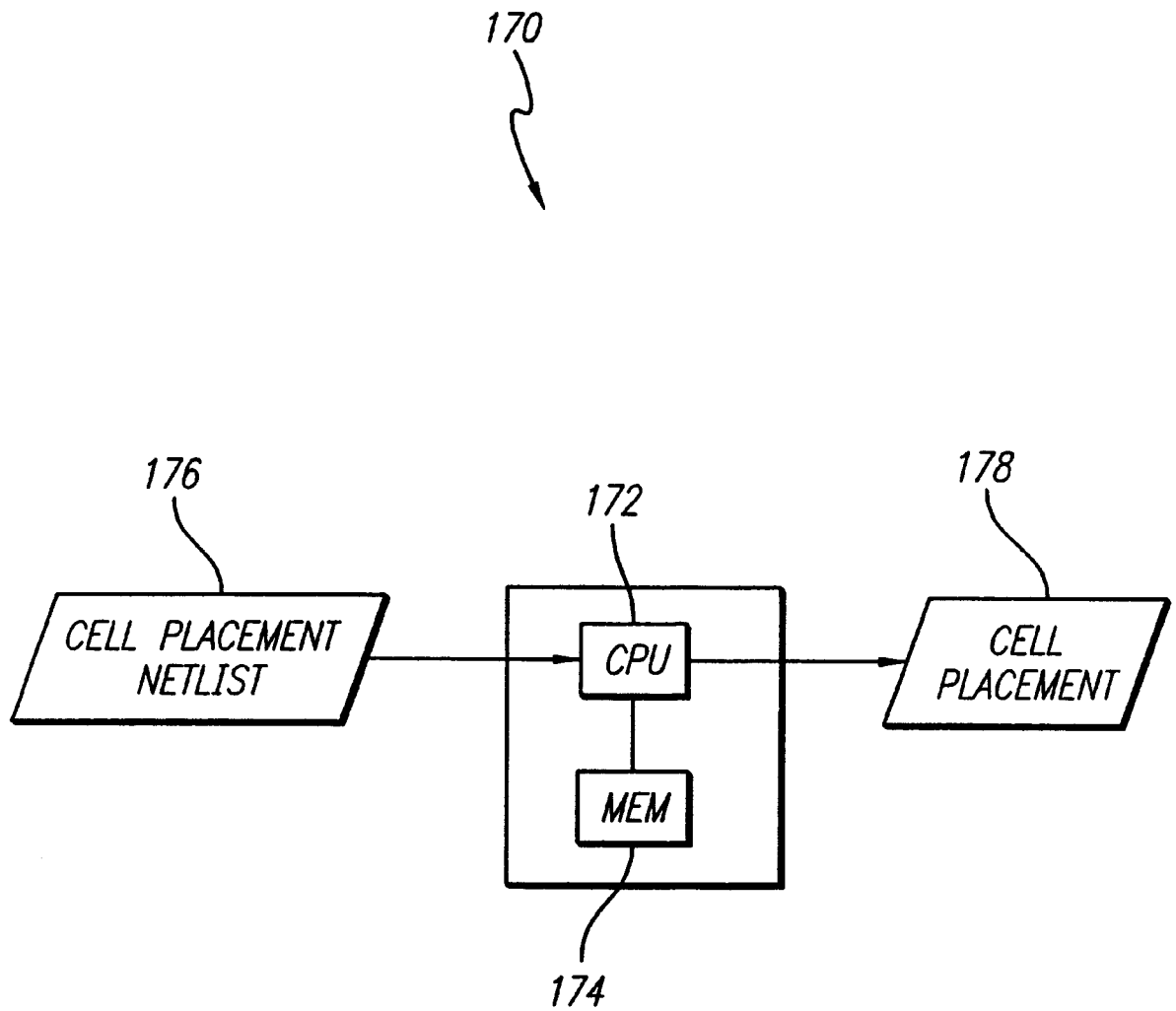
FIG. 12 is a block diagram illustrating an apparatus according to a preferred embodiment of the present invention.

In the example of FIG. 12, with $\mu$ of 0.05 and H of 300, the $H(1-\mu)$ value is 285 and the total_overload is 120 grid units—65 from $S_2$, 40 from $S_3$, and 15 from $S_4$. Note that a segment is overload segment if ch(i) is greater than $H(1-\mu)$ even though all the cells of that segment can be placed within the segment. This is the case for $S_4$.

Next, the radius for each of the segments and free space for each radii are determined. Radius of a segment i, denoted $R_i$, is the distance, or the number of segments, the $i^{th}$ segment is to a nearest segment with overload. An overload segment's $R_i$ value is zero. The following table lists the $R_i$ values for the segments of the example of the sample IC 208 of FIG. 11:

| Segment | Radius, $R_i$, and to which overload segment? |
|---|---|
| 0 | 2 to $S_2$ |
| 1 | 1 to $S_2$ |
| 2 | 0, overload |
| 3 | 0, overload |
| 4 | 0, overload |
| 5 | 1 to $S_4$ |
| 6 | 2 to $S_4$ |
| 7 | 3 to $S_4$ |

In the sample IC 208 of FIG. 11, the radii ranges from zero for the overload segments to three for the furthest segment from an overload segment. If an IC contained hundreds or thousands of columns, then radii can have values from zero to hundreds or even thousands.

The free space for each radius is determined by adding the excess space between the ch(i) and $H(1-\mu)$ for each segment i having the radius. For example, the amount of free space within one segment of the overload segments, therefore having a radius of 1, is the sum of the excess spaces of segments with $R_i$ of 1. Alternatively expressed, $$free\_space(k) = \sum_{i=0, R_i=k}^{n} H(1-\mu) - ch(i)$$

Of course, free_space(0)=0.

In our example of FIG. 12, H=300, $\mu$=0.05, and radius ranges from 0 to 4. The following table lists the free_space for each of the radii:

| Radius, k | free_space(k), and where the free space is found |
|---|---|
| 0 | 0; segments S2 and S3 are overloaded |
| 1 | 70 grid units; 10 from S1 and 60 from S5 |
| 2 | 70 grid units; 60 from S0 and 10 from S6 |
| 3 | 10 grid units from S7 |

As already determined, the total_overload of the present example is 120. From the above table, it is easy to identify the maximum radius, two, required in order to compensate for the overload of 120 grid units. In general, the maximum radius need to compensate for the total_overload is the number $R_{required}$ satisfying the relationship:

$$total\_overload \leq \sum_{k=1}^{R_{required}} free\_space(k)$$

In the present example, $R_{required}$=2. Next, each segment is assigned a new height, ch_new(i), as follows:

The new distribution, denoted ch_new(i), of the cells heights for each of the segments are determined by finding ch_new(i) such that the following two conditions are satisfied:

Condition 1 the sum of the new distribution for the segments equal the sum of the heights of the cells of all the segments, or $$\sum_{i=1}^{n} ch\_new(i) = ch\_total$$

and

Condition 2 ch_new(i) for any segment is less than or equal to a predetermined portion or H, or $ch\_new(i) \leq H(1-\mu)$ For the segments having radius, $R_i$, greater than $R_{required}$, ch_new(i) is set to the original cell height, ch(i), and no cells are moved into the segment. In the present example, the radius of 3 for segment S7 is greater than $R_{required}$, 2, and thus ch_new(7)=ch(7)=275 grid units.

For the segments having radius, $R_i$, less than $R_{required}$, ch_new(i) is set to $H(1-\mu)$. This lead to the reduction of the densities of the overloaded segments to $H(1-\mu)$ while utilizing all the excess space in the segments having $R_i < R_{required}$.

For the segments having radius, $R_i$, equal than $R_{required}$, it may not be necessary to utilize all of the excess spaces of these segments be utilized. In the present example, the total_overload is 120 grid units, and the required radius of segments to compensate for the overload, $R_{required}$, is 2. However, at radius 1, the free_space(1) is 70 grid units. Therefore, the segments comprising radius 2 need only to contribute 50 more grid units to eliminate the overload. Therefore, even though the free_space(2) is 70 grid units, only 50 of the 70 grid units need be allocated. Therefore, the excess space from the segments having radius equal than $R_{required}$ is taken proportionally to their excess capacity. Alternatively expressed, if $R_i = R_{required}$, then $ch\_new(i) = ch(i) + (remainder*(H(1-\mu) - ch(i))/free\_space(R_i))$ where $$remainder = total\_overload - \sum_{k=1}^{R_{required}-1} free\_space(k)$$

For the present example, remainder=50 grid units, and ch_new(1)≈268 and ch_new(6)=282.

After the above technique, the ch_new(i) values for the sample IC is follows:

| Segment i = | ch(i) | ch_new(i) |
|---|---|---|
| 0 | 225 | 268 |
| 1 | 275 | 285 = H(1-$\mu$) |
| 2 | 350 | 285 |
| 3 | 325 | 285 |
| 4 | 300 | 285 |
| 5 | 225 | 285 |
| 6 | 275 | 282 |
| 7 | 275 | 275, no change from ch(i) |
| Total Cell Heights | 2250 | 2250 |

Modify Cell Placement

After the assignment of the new heights of the segments, ch_new(i), the cells are placed as follows:

Sort the list of all cells from all segments by their horizontal coordinate. For the cells having the same horizontal coordinates (from the same column segment) can be sorted randomly. Let $C_0, \ldots C_m$ represent the sorted list of cells.

Then, begin by assigning the cells to the segment beginning with cell $C_0$ and segment $S_0$. The cells are assigned to $S_0$, in order, until the total height of the cells assigned to $S_0$ exceeds ch_new(0). Assuming cells $C_0, \ldots C_p$ are assigned to $S_0$, cells are assigned to the next segment, $S_1$, beginning with cell $C_{p+1}$, until the total heights of the cells assigned exceeds the sum of ch_new() for all the segments with assigned cells. In this case, cells are assigned to $S_1$ until the sum of heights of the cells $C_0, \ldots C_q$ exceed ch_new(0)+ch_new(1) where $C_q$ is the last cell assigned to $S_1$ the height of which caused the sum of the heights of the cells to exceed the sum of the heights of the segments. This process is continued until all the cells are assigned.

If any of the segments are still overloaded after this procedure, the procedure is repeated with a different value of $\mu$ or the Bulldozer technique is used for the final overload removal. The Bulldozer technique is disclosed in the patent application entitled "Advanced Modular Cell Placement System with Overflow Remover", Ser. No. 08/627,334, filed on Jun. 28, 1996. The entire patent application entitled "Advanced Modular Cell Placement System with Overflow Remover", Ser. No. 08/627,334, filed on Jun. 28, 1996 is hereby incorporated into the present patent application.

Iterative Application of the Horizontal and Vertical Congestion Reduction Techniques with Functional Sieve Optimization The horizontal congestion reduction technique and the vertical congestion reduction techniques may be iteratively applied until all congestion is removed or until congestion falls below a predetermined level.

After each application of horizontal congestion reduction and of vertical congestion reduciton, functional sieve optimization 50 of FIG. 2 may be applied to the new placement to reduce the total wire length of the IC which could have increased due to the cell movements. See FIG. 2. The application of functional sieve optimization technique does not create new congestion. The functional sieve optimization technique is disclosed in detail by the patent application entitled "Advanced Modular Cell Placement System with Function Sieve Optimization Technique", Ser. No. 08/627,936, filed on Jun. 28, 1996. The entire patent application entitled "Advanced Modular Cell Placement System with Function Sieve Optimization Technique", Ser. No. 08/627,936, filed on Jun. 28, 1996 is hereby incorporated into the present patent application.

Congestion Removal Apparatus

Now referring to FIG. 12, a computing apparatus 170 for placing cells on an integrated circuit device (IC) is illustrated. The apparatus comprises a processor 172 and memory 174. The memory 174, connected to the processor 172, stores instructions for the processor 172 for the processor 172 to define pieces and segments of the IC, determine density of the pieces, reduce horizontal congestion of the pieces if horizontal congestion exists, and reduce vertical congestion of the pieces if vertical congestion exists. Additionally, the memory may store instructions for the processor to optimize density of the columns of the IC as well as to read cell lists and netlist 176 and to write 178 new cell placement.

The memory 174 may be any kind of machine-readable storage medium containing the instructions for the processor. It is well known in the art that the memory may be formed as a semiconductor memory device, magnetic device, optical device, magneto-optical device, floppy diskette, hard drive, CD-ROM, magnetic tape, computer memory, or memory card.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail herein above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶6.

What is claimed is:

1. A method of reducing congestion on an integrated circuit device (IC) having columns of cells and channels between the columns, said method comprising the steps of:

defining pieces and segments of the IC surface;

determining densities of said pieces;

reducing horizontal congestion of said pieces if the densities of said pieces indicate that horizontal congestion exists; and reducing vertical congestion of said pieces if the densities of said pieces indicate that vertical congestion exists.

2. A method according to claim 1 where said step of defining pieces and segments comprises the steps of:

defining a vertical line in each channel of said IC; and defining horizontal lines across the surface of the IC, such that said vertical lines and said horizontal lines delimit rectangular pieces.

3. A method according to claim 2 where said horizontal lines are equidistant.

4. A method accordingly to claim 2 wherein said horizontal lines are approximately 100 grid units.

5. A method according to claim 1 wherein said step of determining density of each of said pieces comprises the steps of:

determining cell density of said pieces;

determining block density of said pieces;

determining horizontal routing density of said pieces; and determining vertical routing density of said pieces.

6. A method according to claim 5 wherein said cell density is the sum of the heights of cells located in each of said pieces.

7. A method according to claim 5 wherein said block density is the sum of the heights of cell blocks for each of said pieces, said cell blocks comprising pins, vias, and obstacle wires.

8. A method according to claim 5 wherein said horizontal routing density is an expected number of horizontal routing wires through a piece.

9. A method according to claim 5 wherein said horizontal routing density is the sum of probabilities of wires through a piece.

10. A method according to claim 5 where said step of determining horizontal routing density comprises the steps of:

determining routing of wires of the IC to connect pins of the IC; and summing the number of wires traversing each of said pieces.

11. A method according to claim 5 where said step of determining horizontal routing density comprises the steps of:

producing an edgelist having a list of edges describing wire routing of the IC; and summing the probabilities of the edges crossing each of said piece.

12. A method according to claim 11 wherein probability of a normal edge crossing a piece is one.

13. A method according to claim 11 wherein probability of a superedge crossing a piece is inverse of the number of vertical pieces said superedge traverses for each affected column.

14. A method according to claim 11 wherein probability of a superedge crossing a piece is determined by a linear function comprising the steps of:

identifying horizontal grid line, in each column, having highest probability;

assigning zero probability to all grid lines located above and located below the superedge boundary;

forming a linear probability function having said identified grid line with the highest probability and extending on one side of said identified grid line to the high boundary of the superedge and on the other side of said identified grid line to the low boundary of the superedge and having the property that the sum of the probabilities for all horizontal grid lines is one;

determining probability of each of grid lines lying within the superedge; and summing probability of all grid lines lying within each of the pieces.

15. A method according to claim 5, further comprising a step of resizing said pieces, wherein said step of resizing said pieces comprises the steps of:

defining a value H as the size of a column segment in grid units;

defining a function, size(i, j, q), as representing the greater value between cell density and a sum of block density and horizontal routing density multiplied by a first factor q, wherein i represents the column, j represents the pieces of the column, and q is said first factor;

adjusting said H by multiplying said H by a predetermined piece size factor Q; and determining the value of said first factor q satisfying the following equation:

$$\sum_{j=j_{\min}}^{j_{\max}} \text{size}(i, j, q_i) = H$$

wherein $j_{min}$ is the first piece of the column i, and $j_{max}$ is the last piece of the column i.

16. A method according to claim 5 wherein said vertical routing density is the average of the expected number of vertical wires through the horizontal grid lines of a piece.

17. A method according to claim 5 wherein said step of determining vertical routing density of a piece, P(i, j), comprises the steps of:

increasing the density of the piece by value
$(y_{max}-y_{min}+1)/(\text{top}(i, j)-\text{bottom}(i, j)+1)$
for vertical edges; and increasing the density of the piece by value $$\frac{factor(i) * d(i, j)}{\sum_{t=i_1}^{i_2} factor(t) * d(i, j)} * \frac{y_{\max} - y_{\min} + 1}{top(i, j) - bottom(i, j) + 1}$$

-continued for superedges.

18. A method according to claim 1 wherein horizontal congestion exists when a sum of larger of cell density or sum of block density and horizontal density for all pieces of a segment is greater than product of height of the segment and a desired segment size factor.

19. A method according to claim 18 wherein said desired segment size factor is 0.85.

20. A method according to claim 1 wherein said step of reducing horizontal congestion comprises the steps of:
   resizing said pieces;
   smoothing rows of said pieces;
   removing excess heights from said pieces of over-allocated segments;
   distributing excess heights to said pieces of under-allocated segments; and
   modifying cell placement in accordance with new heights of said pieces.

21. A method according to claim 1 wherein said step of reducing vertical congestion comprises the steps of:
   resizing said pieces to modify location and widths of said pieces from original location and original widths to new location and new widths;
   smoothing columns of said pieces; and
   modifying cell placement in accordance with new location and new widths of said pieces compared to original location and original widths of said pieces.

22. A method according to claim 21 wherein said step of reducing vertical congestion further comprises the steps of:
   resolving cell overload within said segments; and
   resolving cell overlaps of said segments.

23. A method according to claim 1 further comprising the step of optimizing continuous column density.

24. A method according to claim 23 wherein said step of optimizing continuous column density comprises the steps of:
   defining segments and row of segments;
   determining new density distribution of said segments; and
   modifying cell placement to achieve said new density distribution of said segments.

25. An apparatus for reducing congestion on an integrated circuit device (IC) having cells, and columns and channels, said apparatus comprising:
   a processor;
   a memory connected to said processor;
   said memory having instructions for said processor to
      define pieces and segments of the IC surface;
      determine density of said pieces;
      reduce horizontal congestion of said pieces if the densities of said pieces indicate that horizontal congestion exists; and
   reducing vertical congestion of said pieces if the densities of said pieces indicate that vertical congestion exists.

26. An apparatus according to claim 25 wherein said memory further comprises instructions for said processor to optimize density of column of the IC.

27. An apparatus according to claim 25 wherein said memory further comprises instructions for said processor to:
   read a cell list and a netlist; and
   write a new cell placement.

28. A machine-readable storage medium containing instructions for a processor, said instructions including steps of:
   defining pieces and segments of an integrated circuit device (IC) surface;
   determining density of said pieces;
   reducing horizontal congestion of said pieces if the densities of said pieces indicate that horizontal congestion exists; and
   reduce vertical congestion of said pieces if the densities of said pieces indicate that vertical congestion exists.

29. A storage medium according to claim 28 wherein said storage medium is selected from a group consisting of semiconductor memory device, magnetic device, optical device, magneto-optical device, floppy diskette, hard drive, CD-ROM, magnetic tape, computer memory, and memory card.

* * * * *